United States Patent [19]
Miyaoka et al.

[11] Patent Number: 5,220,187
[45] Date of Patent: Jun. 15, 1993

[54] SEMICONDUCTOR INTEGRATED CIRCUIT WITH BIPOLAR TRANSISTORS AND MOSFETS

[75] Inventors: Shuuichi Miyaoka, Ohme; Masanori Odaka, Kodaira; Katsumi Ogiue, Hinode, all of Japan

[73] Assignee: Hitachi, Ltd., Tokyo, Japan

[21] Appl. No.: 917,907

[22] Filed: Jul. 21, 1992

Related U.S. Application Data

[63] Continuation of Ser. No. 333,028, Apr. 4, 1989, abandoned.

[30] Foreign Application Priority Data

Apr. 6, 1988 [JP] Japan .................. 63-8549

[51] Int. Cl.$^5$ .......................................... H01L 27/02
[52] U.S. Cl. ....................................... 257/378; 257/401
[58] Field of Search ................. 357/40, 41, 42, 43, 357/45

[56] References Cited

U.S. PATENT DOCUMENTS

| | | | |
|---|---|---|---|
| 4,766,475 | 8/1988 | Kawashima | 357/45 |
| 4,783,692 | 11/1988 | Uratani | 357/45 |
| 4,868,626 | 9/1989 | Nakazato et al. | 357/43 |
| 5,001,365 | 3/1991 | Murabayashi et al. | 307/446 |
| 5,059,821 | 10/1991 | Murabayashi et al. | 307/360 |

FOREIGN PATENT DOCUMENTS

84104177.5 11/1984 European Pat. Off. .
0189183 1/1986 European Pat. Off. .
2540311 12/1983 France .

OTHER PUBLICATIONS

Patent Abstracts of Japan, vol. 9, No. 244 (E-346) (1967), Sep. 30, 1985.
Patent Abstracts of Japan, vol. 7, No. 144 (E-183) (1289), Jun. 23, 1983.

Primary Examiner—Rolf Hille
Assistant Examiner—Roy Potter
Attorney, Agent, or Firm—Antonelli, Terry, Stout & Kraus

[57] ABSTRACT

A logic circuit to be formed in a gate array is selected depending upon the value of the output load capacitance thereof, from among a CMOS circuit, a first Bi-CMOS circuit including an output bipolar transistor whose emitter size is set at a predetermined value, and a second Bi-CMOS circuit including an output bipolar transistor whose emitter size is larger than the emitter size of the output bipolar transistor of the first Bi-CMOS circuit. That is, the logic circuit is brought into a circuit form whose output load capacitance can be charged and discharged fastest. As a result, the logic circuit constructed in the gate array by adopting such a design technique has its operating speed raised. An improved structure is also provided for reducing wiring lengths by arranging bipolar transistors in adjacent basic cells to have mirror symmetry with one another. Further, particular gate width relationships are provided between MOSFETs within basic cells for reducing propagation delay and the required occupation area.

46 Claims, 9 Drawing Sheets

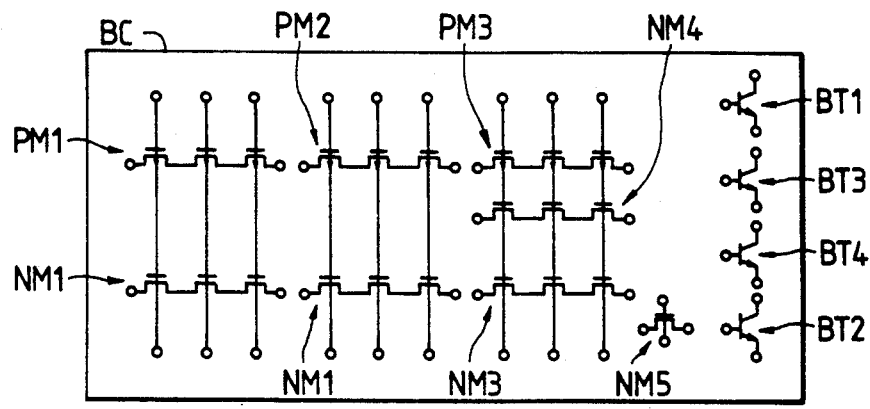
FIG. 8
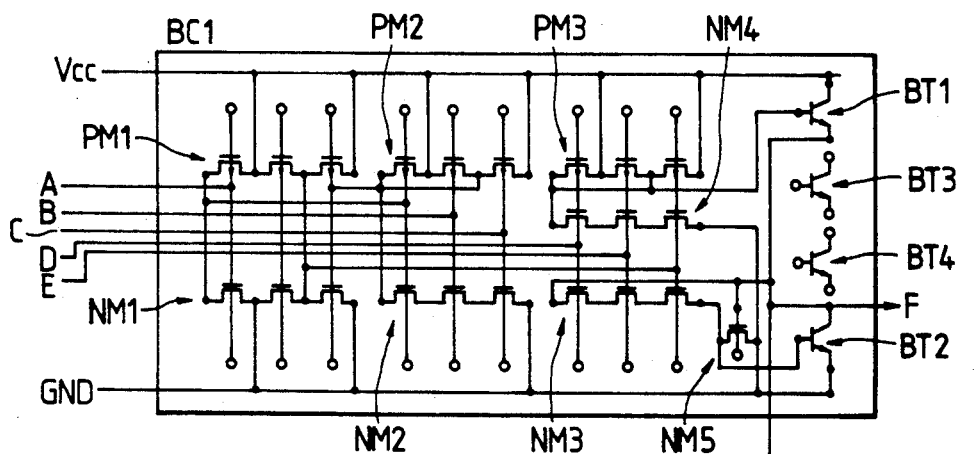
FIG. 9
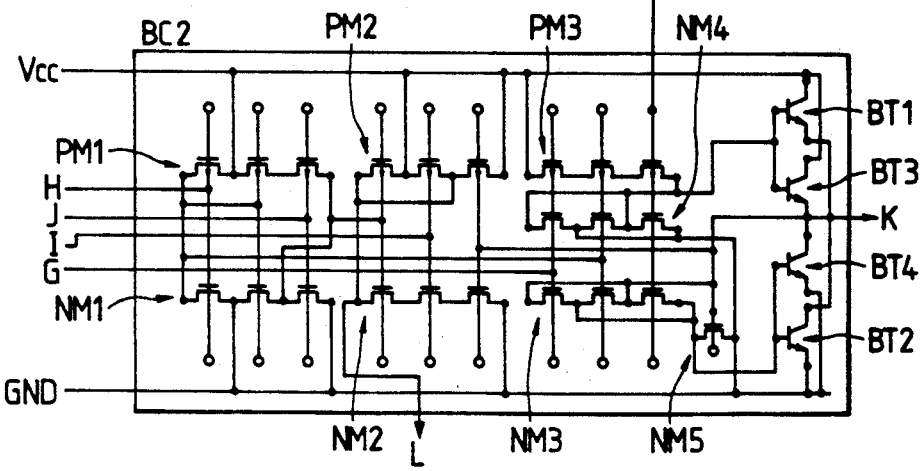

SEMICONDUCTOR INTEGRATED CIRCUIT WITH BIPOLAR TRANSISTORS AND MOSFETS

This application is a continuation of application Ser. No. 333,028, filed on Apr. 4, 1989 now abandoned.

BACKGROUND OF THE INVENTION

This invention relates to a semiconductor integrated circuit, and to techniques which are particularly effective when utilized for, for example, a bipolar-CMOS (hereinbelow, abbreviated to "Bi-CMOS") gate array.

A Bi-CMOS complex logic gate circuit which comprises in combination a pair of output bipolar transistors in a totem pole form and a CMOS (complementary MOS) logic gate circuit, has both a comparatively high drivability and a low power consumption property.

Therefore, Bi-CMOS logic gates have come to be applied to various semiconductor devices, for example, gate array devices and memory devices and to microcomputers (refer to IEEE Journal of SOLID-STATE CIRCUITS, Vol. 23, No. 1, February 1988, pp. 5-11).

In this regard, a gate array employing Bi-CMOS logic gates is disclosed in the official gazette of Japanese Patent Application Laid-open No. 59-139724 (corresponding U.S. Pat. No. 4,689,503, corresponding Korean Patent Application No. 1983-5666, and corresponding British Patent No. 2135148).

Besides, basic cells for use in Bi-CMOS gate array devices are described in the official gazette of Japanese Patent Application Laid-open No. 61-171150 (corresponding U.S. Pat. Ser. No. 822,786, corresponding Korean Patent Application No. 1985-9158, and corresponding European Patent Application Laid-open No. 0.189.183A1), the official gazette of Japanese Patent Application Laid-open No. 59-193627 (corresponding U.S. Pat. Ser. No. 600,965, and corresponding European Patent Application Laid-open No. 0.125.504A1), "AMCC's BiCMOS ARRAY HITS RECODE GATE UTILIZATION" published in Electronics/Feb. 4, 1988, pp. 65-66 by Bernard C. Cole, and "Low Power High Speed BiCMOS Gate-Array" published in NEC Technical Bulletin, Vol. 39, No. 10/1986, pp. 138-143 by Nakashiba et al.

Incidentally, the "gate array" is a semiconductor integrated circuit device of the so-called master slice method according to which many kinds of semiconductor integrated circuit devices can be realized in such a way that master wafers prepared in large amounts beforehand are merely subjected to the wiring steps of the respective kinds of articles. This method has such advantages as the reduction of cost based on the mass production of the master wafers and the shortening of a development period based on the automatic design of wiring and the short manufacturing process of only the wiring operation.

SUMMARY OF THE INVENTION

The prior-art Bi-CMOS gate array as stated above has the following problem:

As illustrated in FIG. 7, in a case where a Bi-CMOS logic gate circuit has a comparatively high load capacitance CL coupled to its output terminal, the propagation delay time $t_{pd}$ thereof becomes shorter as compared with that of a CMOS logic gate circuit. However, in a case where the Bi-CMOS logic gate circuit has a comparatively low load capacitance CL coupled, the propagation delay time $t_{pd}$ thereof becomes longer as compared with that of the CMOS logic gate circuit contrariwise.

On the other hand, the propagation delay time $t_{pd}$ of the Bi-CMOS logic gate circuit exhibits a similar load-dependency in accordance with the drivability thereof, namely, the emitter size ES of the output transistor thereof as illustrated in FIG. 7. More specifically, in a case where the emitter size ES of the output transistor is enlarged to heighten the drivability thereof, the propagation delay time $t_{pd}$ becomes shorter in a region of high load capacitance CL and conversely becomes longer in a region of low load capacitance CL than in a case where the emitter size ES is made small.

That is, a logic circuit is constructed by selectively combining the CMOS logic gate circuits and the Bi-CMOS logic gate circuits in accordance with the load capacitances CL to be coupled to the output terminals of individual logic gate circuits, in other words, with fan-out, and the drivabilities of the individual logic gate circuits are optimized, whereby the propagation delay time $t_{pd}$ of the logic circuit is minimized.

The basic cell of the prior-art Bi-CMOS gate array, however, does not include any bipolar transistor which serves, in effect, to enlarge the emitter size ES of the output transistor of the Bi-CMOS logic gate circuit and heighten the drivability thereof. The layout of the individual basic cells is not contrived, either, so that the emitter size of the output bipolar transistor can be, in effect, enlarged. It has therefore been revealed that, since the drivabilities of the individual logic gate circuits are difficult of being optimized according to the load capacitances thereof, the overall propagation delay time $t_{pd}$ of the logic circuit to be constructed of the gate array cannot be shortened as desired, with the result that the high speed operation of the logic circuit is hampered.

An object of this invention is to provide the basic cells of a gate array and a method of laying them out according to which CMOS logic gate circuits and Bi-CMOS logic gate circuits can be efficiently constructed in accordance with required drivabilities.

Another object of this invention is to attain a higher density of integration of a gate array, and to attain a higher operating speed of a logic circuit constructed of the gate array.

The aforementioned and other objects and novel features of this invention will become apparent from the description of this specification when read in conjunction with the accompanying drawings.

A typical aspect of performance of this invention is briefly summarized as follows:

A gate array is configured of a plurality of basic cells laid out in a checkered pattern, in which first cells to be used basically for constructing CMOS logic gate circuits and second cells to be used basically for constructing Bi-CMOS logic gate circuits are included at a predetermined ratio, and which include a pair of bipolar transistors to be selectively used when a high drivability is required for the Bi-CMOS logic gate circuit.

According to the above expedient, the CMOS logic gate circuits and Bi-CMOS logic gate circuits which are optimized in accordance with required drivabilities can be constructed efficiently without waste by optimalizing the ratio of the first and second cells which are included in the basic cells. Thus, the utilization factor of gates included in the gate array is enhanced. Since the gate utilization factor is enhanced, the number of circuit elements within the gate array is reduced, and the density of integration of the gate array can be heightened.

Further, the logic circuit to be formed in the gate array is selected depending upon the value of the output load capacitance thereof, from among a CMOS circuit, a first Bi-CMOS circuit including an output bipolar transistor whose emitter size is set at 3 $\mu m^2$ by way of example, and a second Bi-CMOS circuit including an output bipolar transistor whose emitter size is larger than the emitter size of the output bipolar transistor of the first Bi-CMOS circuit. That is, the logic circuit is brought into a circuit form whose output load capacitance can be charged and discharged fastest. As a result, the logic circuit constructed in the gate array by adopting the design technique as stated before has its operating speed raised.

BRIEF DESCRIPTION OF THE DRAWINGS

FIG. 8 is an equivalent circuit diagram of the basic cell in FIG. 1;

FIG. 9 is a plan view in the case where the circuit shown in FIG. 3 is formed using the equivalent circuit diagram depicted in FIG. 8;

DESCRIPTION OF THE PREFERRED EMBODIMENTS

Figure 1:
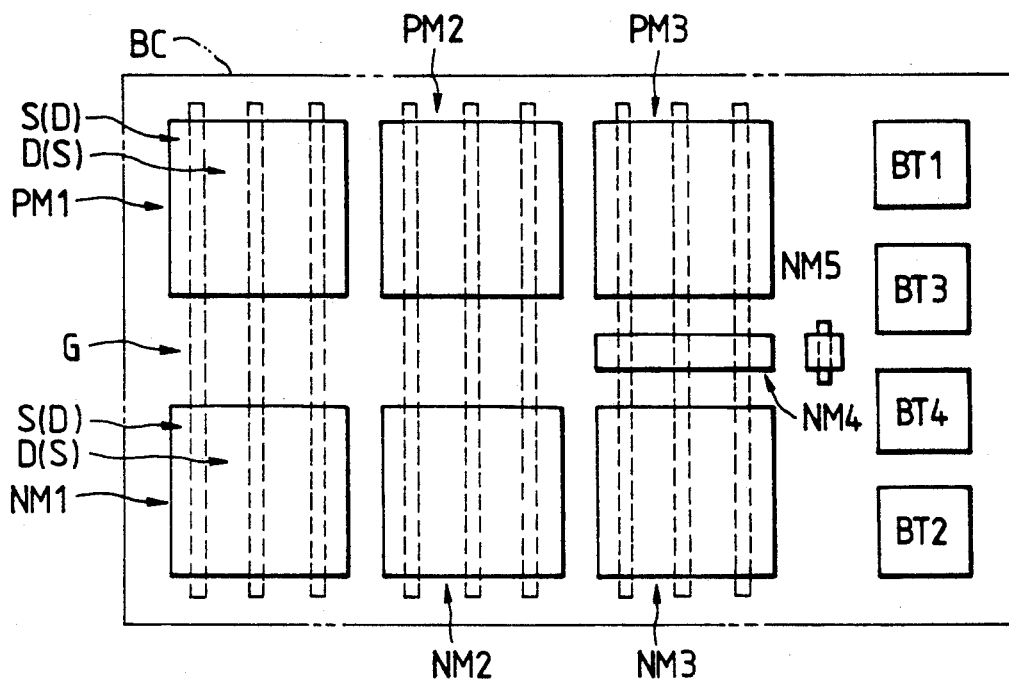
FIG. 1 is a layout diagram showing an embodiment of a basic cell included in a gate array to which this invention is applied.
Figure 2:
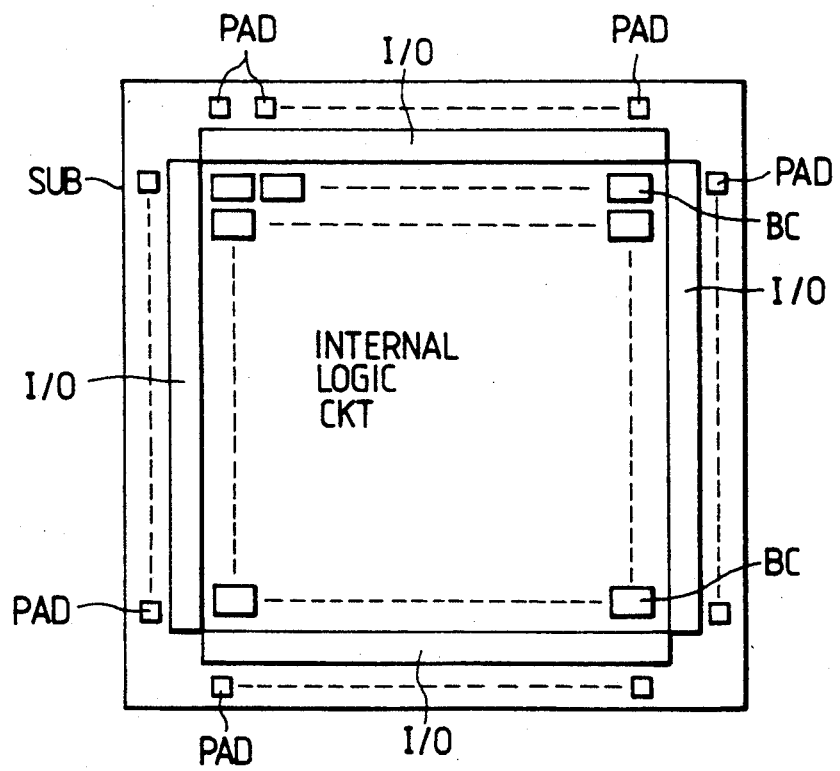
FIG. 2 is a plan view showing an embodiment of the gate array which includes the basic cells as shown in FIG. 1.

FIG. 2 shows a layout diagram of a gate array to which this invention is applied. In addition, FIG. 1 shows a layout diagram of an embodiment of the basic cell BC of the gate array illustrated in FIG. 2. By the way, in this invention, the "basic cell" is defined as a basic unit in layout including a plurality of semiconductor elements. Although not especially restricted, the basic cells BC constituting the gate array in FIG. 2 and various circuit elements in FIG. 1 constituting each of the basic cells BC are formed on a single semiconductor substrate such as of single-crystal silicon.

Referring to FIG. 2, although no special restriction is meant, the gate array includes a plurality of external connection terminals "pad" which are arranged on the peripheral part of the square semiconductor substrate SUB and which are used as signal input/output terminals, internal logic circuits which are regularly arranged on the central part of the semiconductor substrate SUB and each of which includes at least two of the basic cells BC, and input/output buffer circuits I/O which are arranged between the internal logic circuits and the external terminals "pad". Incidentally, FIG. 2 exemplifies the gate array of the type which has no wiring channel.

Although not especially restricted, all the basic cells BC included in the gate array have the same construction. As shown in FIG. 1 by way of example, the construction includes three PMOS regions PM1-PM3, five NMOS regions NM1-NM5 and four bipolar transistor regions BT1-BT4. Among them, each of the PMOS regions PM1-PM3 includes three P-channel MOSFETs each of which is endowed with a comparatively high conductance. Besides, each of the NMOS regions NM1-NM3 includes three N-channel MOSFETs each of which is endowed with a comparatively high conductance, and the NMOS region NM4 includes three N-channel MOSFETs each of which is endowed with a comparatively low conductance. Further, the NMOS region NM5 includes a single N-channel MOSFET which is endowed with a comparatively low conductance. In addition, each of the bipolar transistor regions BT1-BT4 includes a single bipolar transistor which is endowed with a predetermined size, for example, $1 \times 3$ $\mu m^2$.

In each basic cell BC, gates G made of polycrystalline silicon are respectively formed between the sources S and drains D of the P-channel MOSFETs constituting the PMOS region PM1 though no special restriction is intended. These gates G are extended between the sources S and drains D of the corresponding N-channel MOSFETs of the NMOS region NM1. Thus, the gates of the individual P-channel MOSFETs of the PMOS region PM1 and the corresponding N-channel MOSFETs of the NMOS region NM1 are respectively coupled in common. The three P-channel MOSFETs and N-channel MOSFETs provided in the PMOS region PM1 and NMOS region NM1 are regarded as the first cell of this basic cell BC, and they can be utilized for constructing a 3-input CMOS logic gate circuit which is configured of three sets of CMOS transistors, or a 2-input CMOS logic gate circuit and a CMOS inverter circuit (in other words, a 1-input CMOS logic gate circuit) which correspond to the 3-input CMOS logic gate circuit.

Likewise, the gates G of the individual P-channel MOSFETs of the PMOS region PM2 are respectively coupled in common with the gates G of the corresponding N-channel MOSFETs of the NMOS region NM2. The three P-channel MOSFETs and N-channel MOSFETs provided in the PMOS region PM2 and NMOS region NM2 are similarly regarded as the first cell of this basic cell BC, and they can be utilized for constructing a 3-input logic gate circuit which is configured of three sets of CMOS transistors, or a 2-input logic gate circuit and a CMOS inverter circuit which correspond to the 3-input logic gate circuit.

On the other hand, the gates G of the individual P-channel MOSFETs of the PMOS region PM3 are respectively coupled in common with the gates G of the corresponding N-channel MOSFETs of the NMOS region NM4 and further in common with the gates G of the corresponding N-channel MOSFETs of the NMOS region NM3. The three P-channel MOSFETs provided in the PMOS region PM3 and the six N-channel MOSFETs provided in the NMOS regions NM3 and NM4 are regarded as constituting the second cell of this basic cell BC together with the single N-channel MOSFET provided in the NMOS region NM5 and the four bipolar transistors provided in the bipolar transistor regions BT1-BT4, and they can be utilized for constructing a Bi-CMOS logic gate circuit of 2 inputs to 3 inputs or a Bi-CMOS inverter circuit (in other words, a Bi-CMOS logic gate circuit of 1 input).

In the PMOS regions PM1-PM3, the respective P-channel MOSFETs are formed in such a way that boron is introduced into the semiconductor substrate by employing the gates as an impurity introducing mask. In the NMOS regions NM1-NM5, the respective N-channel MOSFETs are formed in such a way that phosphorus or arsenic is introduced into the semiconductor substrate by employing the gates as an impurity introducing mask.

In the gate array of this embodiment, the Bi-CMOS logic gate circuit can have a selected one of two stages of drivabilities though no special restriction is meant. More specifically, when a comparatively low drivability is required of the Bi-CMOS logic gate circuit, the two bipolar transistors formed in the bipolar transistor regions BT1 and BT2 are set as output transistors. On the other hand, when a comparatively high drivability is required of the Bi-CMOS logic gate circuit, the pair of bipolar transistors formed in the bipolar transistor regions BT3 and BT4 are respectively connected in parallel with output-stage bipolar transistors which are configured of the bipolar transistors formed in the regions BT1 and BT2. By the way, FIG. 8 schematically shows the circuit elements which are included in the basic cell BC in FIG. 1.

Figure 3:
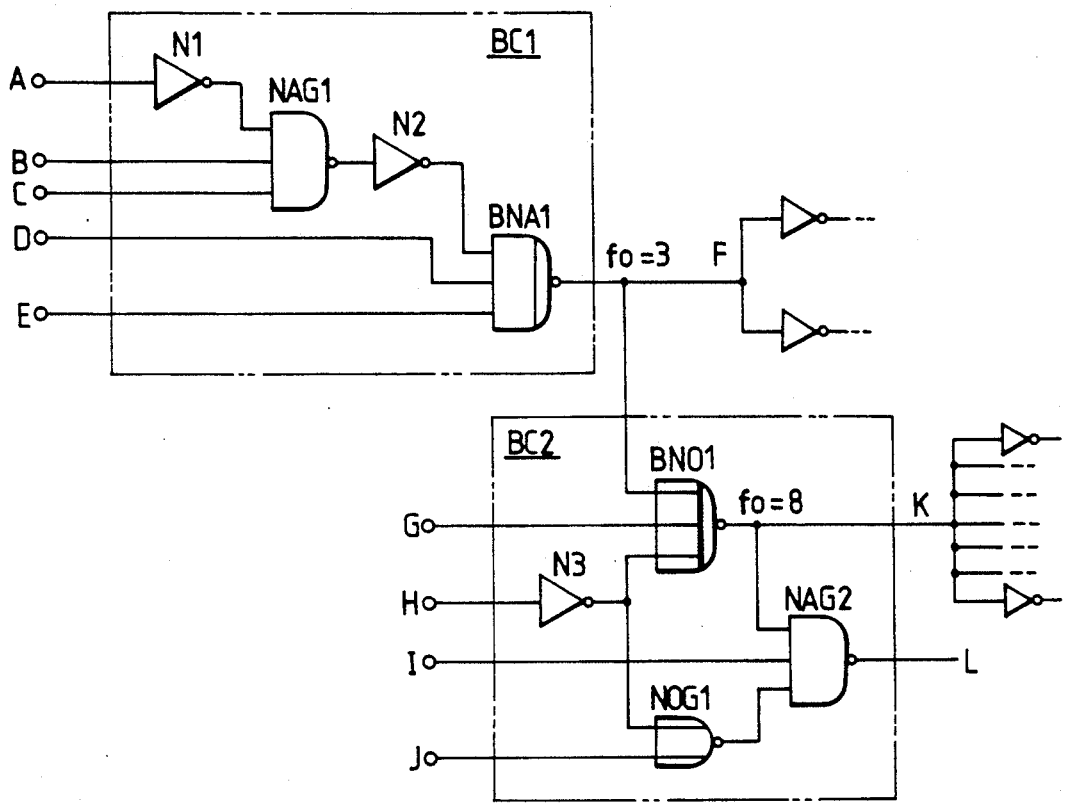
FIG. 3 is a circuit diagram showing part of an embodiment of a logic circuit which is constructed of the gate array in FIG. 2.

FIG. 3 shows part of a circuit diagram of an example of a logic circuit which is constructed of the gate array in FIG. 2. In addition, FIG. 4 thru FIGS. 6(a) and 6(b) show circuit diagrams of a CMOS inverter circuit N1, a CMOS NAND gate circuit NAG1, a Bi-CMOS NAND gate circuit BNA1 and a Bi-CMOS NOR gate circuit BNO1 which are included in the logic circuit in FIG. 3, respectively. In these figures, a MOSFET whose channel (back gate) portion has an arrow affixed thereto is of the P-channel type and is distinguished from an N-channel MOSFET to which the arrow is not assigned. Besides, all of illustrated bipolar transistors are NPN-type transistors. Regarding FIG. 3, the concrete processing conditions of the logic circuit and the logic conditions of various input signals and output signals are not directly pertinent to this invention and shall not be explained in detail.

Referring to FIG. 3, although not especially restricted, an input signal A supplied from the unshown circuit of the logic circuit is inverted by a CMOS inverter circuit N1 and is thereafter supplied to the first input terminal of a CMOS NAND gate circuit NAG1. The second and third input terminals of the CMOS NAND gate circuit NAG1 are respectively supplied with input signals B and C from the unshown circuits of the logic circuit. An output signal from the CMOS NAND gate circuit NAG1 is inverted by a CMOS inverter circuit N2, and is thereafter supplied to the first input terminal of a Bi-CMOS NAND gate circuit BNA1. The second and third input terminals of the Bi-CMOS NAND gate circuit BNA1 are respectively supplied with input signals D and E from the unshown circuits of the logic circuit. An output signal F from the Bi-CMOS NAND gate circuit BNA1 is supplied to the first input terminal of a Bi-CMOS NOR gate circuit BNO1, and is also supplied to the other circuits of the logic circuit. The output signal F of the Bi-CMOS NAND gate circuit BNA1 is supplied to the input terminals of the logic gate circuits totaling three, and the fan-out "fo" thereof is three. The "fan-out" is defined as the number of inputs to succeeding-stage circuits which are coupled to the output terminal of one circuit and which are driven by this circuit.

Figure 4:
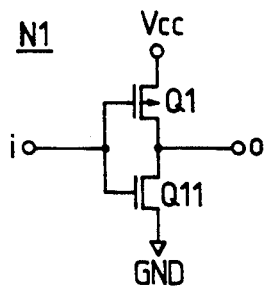
FIG. 4 is a circuit diagram showing an embodiment of a CMOS inverter circuit which is included in the logic circuit in FIG. 3.

Here, as shown in FIG. 4, the CMOS inverter circuit N1 includes a P-channel MOSFET Q1 and an N-channel MOSFET Q11 whose source-drain paths are provided in a series form across the power supply voltage $V_{cc}$ and ground potential GND of circuitry. The gates of the MOSFETs Q1 and Q11 are coupled in common, and are used as the input terminal i of the CMOS inverter circuit N1. In addition, the drains of the MOSFETs Q1 and Q11 coupled in common are used as the output terminal o of the CMOS inverter circuit N1. Thus, the output signal o of the CMOS inverter circuit N1 is set at a low level such as the ground potential of the circuitry when the input signal i is at its high level, and it is set at a high level such as the power supply voltage $V_{cc}$ of the circuitry when the input signal i is at its low level.

The CMOS inverter circuit N2 has the same circuit arrangement as that of the CMOS inverter circuit N1.

In this embodiment, although no special restriction is meant, the MOSFET Q1 of the CMOS inverter circuit N1 is constructed of the first P-channel MOSFET provided in the PMOS region PM1 of the basic cell BC1, and the MOSFET Q11 is constructed of the first N-channel MOSFET provided in the NMOS region NM1. Likewise, although no special restriction is meant, the MOSFET Q1 of the CMOS inverter N2 is constructed of the second or third P-channel MOSFET provided in the PMOS region PM1 of the basic cell BC1, and the MOSFET Q11 is constructed of the second or third N-channel MOSFET provided in the NMOS region NM1.

Figure 5:
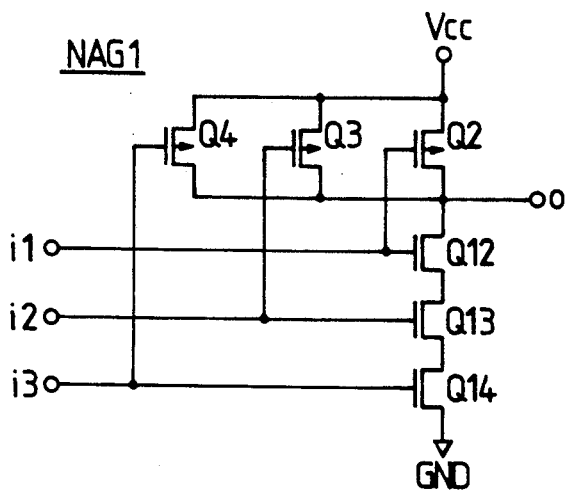
FIG. 5 is a circuit diagram showing an embodiment of a CMOS NAND gate circuit which is included in the logic circuit in FIG. 3.

Next, as shown in FIG. 5, the CMOS NAND gate circuit NAG1 includes a P-channel MOSFET Q2 and N-channel MOSFETs Q12-Q14 whose source-drain paths are provided in a series form across the power supply voltage $V_{cc}$ and ground potential GND of the circuitry. The source-drain path of the MOSFET Q2 is further provided with the source-drain paths of P-channel MOSFETs Q3 and Q4 in a parallel form. The gate of the MOSFET Q2 is coupled in common with that of the MOSFET Q12, and the common gate node is used as the first input terminal i1 of the CMOS NAND gate circuit NAG1. Likewise, the gates of the MOSFETs Q3 and Q4 are respectively coupled in common with those of the MOSFETs Q13 and Q14, and the common gate nodes are respectively used as the second and third input terminals i2 and i3 of the CMOS NAND gate circuit NAG1. Thus, the output signal o of the CMOS NAND gate circuit NAG1 is set at a low level such as the ground potential GND of the circuitry when all the input signals i1–i3 are at their high levels, and it is set at a high level such as the power supply voltage $V_{cc}$ of the circuitry when any of the input signals i1–i3 is at its low level.

In this embodiment, although not especially restricted, the P-channel MOSFETs Q2–Q4 of the CMOS NAND gate circuit NAG1 are constructed of the first - third P-channel MOSFETs provided in the PMOS region PM2 of the basic cell BC1. In addition, the N-channel MOSFETs Q12–Q14 are constructed of the first - third N-channel MOSFETs provided in the NMOS region NM2 of the basic cell BC1.

Figure 6A:
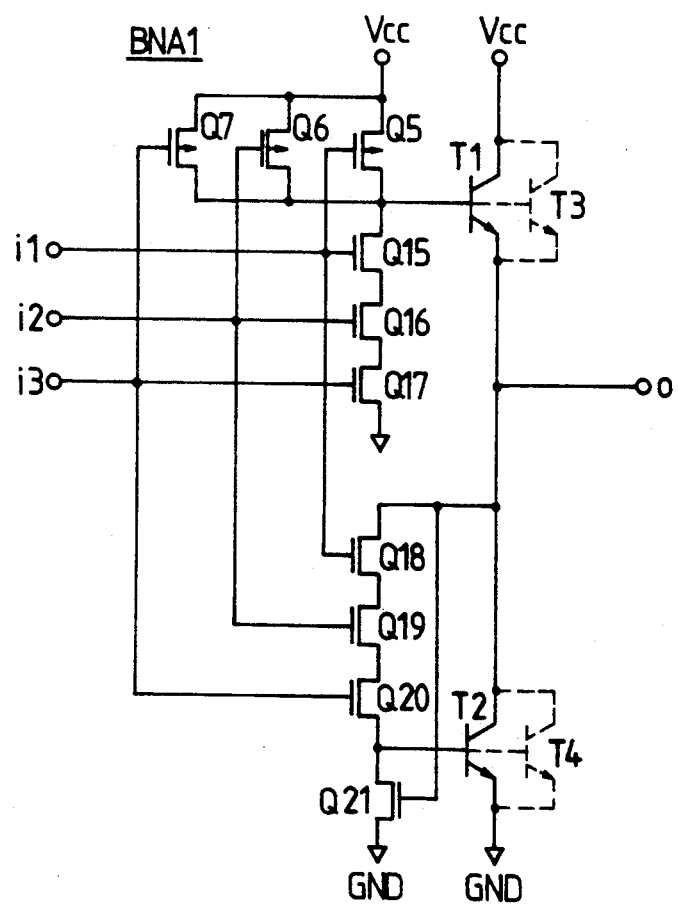
FIG. 6(a) is a circuit diagram showing an embodiment of a Bi-CMOS NAND gate circuit which is included in the logic circuit in FIG. 3.

As shown in FIG. 6(a), the Bi-CMOS NAND gate circuit BNA1 includes output bipolar transistors T1 and T2 in a totem pole form the collector-emitter paths of which are connected in series across the power supply voltage $V_{cc}$ and ground potential GND of the circuitry. The common-coupled node of the emitter of the output transistor T1 and the collector of the output transistor T2 is used as the output terminal o of the Bi-CMOS NAND gate circuit BNA1. Three P-channel MOSFETs Q5–Q7 whose source-drain paths are held in a parallel form are provided across the base of the output transistor T1 and the power supply voltage $V_{cc}$ of the circuitry. In addition, three N-channel MOSFETs Q15–Q17 whose source-drain paths are held in a series form are provided across the base of the output transistor T1 and the ground potential GND of the circuitry. These MOSFETs Q5–Q7 and Q15–Q17 construct a 3-input CMOS NAND gate circuit similar to that shown in FIG. 5. On the other hand, three N-channel MOSFETs Q18–Q20 whose source-drain paths are held in a series form are provided across the base of the output transistor T2 and the output terminal o. In addition, an N-channel MOSFET Q21 whose gate is coupled in common with the output terminal o is provided across the base of the output transistor T2 and the ground potential GND of the circuitry. The gates of the MOSFETs Q18–Q20 are respectively coupled in common with those of the corresponding MOSFETs Q15–Q17, and the common gate nodes are respectively used as the first - third input terminals i1–i3 of the Bi-CMOS NAND gate circuit BNA1. Thus, the output signal o of the Bi-CMOS NAND gate circuit BNA1 is set at a high level which is lower than the power supply voltage $V_{cc}$ of the circuitry by the base-emitter voltage of the output transistor T1, when all the input signals i1–i3 are at their high levels, and it is set at a low level which is higher than the ground potential GND of the circuitry by the base-emitter voltage of the output transistor T2, when any of the input signals i1–i3 is at its low level.

In this embodiment, although not especially restricted, the output transistors T1 and T2 of the Bi-CMOS NAND gate circuit BNA1 are respectively constructed of the bipolar transistors provided in the bipolar transistor regions BT1 and BT2 of the basic cell BC1. Besides, the P-channel MOSFETs Q5–Q7 and the N-channel MOSFETs Q15–Q17 are respectively constructed of the first - third P-channel MOSFETs and N-channel MOSFETs provided in the PMOS region PM3 and NMOS region NM3 of the basic cell BC1. Further, the N-channel MOSFETs Q18–Q20 are respectively constructed of the first - third N-channel MOSFETs provided in the NMOS region NM4 of the basic cell BC1, and the N-channel MOSFET Q21 is constructed of the single N-channel MOSFET provided in the NMOS region NM5.

Meanwhile, in the embodiment in FIG. 3, the fan-out "fo" of the Bi-CMOS NAND gate circuit BNA1 is set at 3, so that the output stage of the Bi-CMOS NAND gate circuit BNA1 is configured of the pair of transistors T1 and T2. In a case where a comparatively high drivability is required of the Bi-CMOS NAND gate circuit BNA1, namely, where the fan-out "fo" is at least 7 by way of example, the output transistors T1 and T2 are respectively provided with output transistors T3 and T4 in a parallel form as indicated by dotted lines in FIG. 6(a). Although not especially restricted, the output transistors T3 and T4 are respectively constructed of the pair of bipolar transistors provided in the bipolar transistor regions BT3 and BT4 of the basic cell BC1.

Referring to FIG. 3, the second and third input terminals of the Bi-CMOS NOR gate circuit BNO1 are respectively supplied with an input signal G and the inverted signal of an input signal H produced by a CMOS inverter circuit N3, the signals G and H being sent from the unshown circuits of the logic circuit. An output signal K from the Bi-CMOS NOR gate circuit BNO1 is supplied to the first input terminal of a CMOS NAND gate circuit NAG2, and is also supplied to the other circuits of the logic circuit. The output signal K of the Bi-CMOS NOR gate circuit BNO1 is supplied to the input terminals of the logic gate circuits totaling eight, and the fan-out "fo" thereof is eight. The second input terminal of the CMOS NAND gate circuit NAG2 is supplied with an input signal I from the unshown circuit of the logic circuit, and the third input terminal thereof is supplied with an output signal from a CMOS NOR gate circuit NOG1. The first input terminal of the CMOS NOR gate circuit NOG1 is supplied with the output signal of the CMOS inverter circuit N3, and the second input terminal thereof is supplied with an input signal J from the unshown circuit of the logic circuit.

Here, the CMOS inverter circuit N3 has the same circuit arrangement as that of the CMOS inverter circuit N1 or N2, and although not especially restricted, it is configured of the first P-channel MOSFET provided in the PMOS region PM1 of the basic cell BC2, and the first N-channel MOSFET provided in the NMOS region NM1. Likewise, the CMOS NAND gate circuit NAG2 has the same circuit arrangement as that of the NAND gate circuit NAG1, and although not especially restricted, it is configured of the three P-channel MOSFETs provided in the PMOS region PM2 of the basic cell BC2, and the three N-channel MOSFETs provided in the NMOS region NM2.

Next, as is conjecturable from the NAND gate circuits NAG1 and NAG2, the CMOS NOR gate circuit NOG1 includes two P-channel MOSFETs in a series form and two N-channel MOSFETs in a parallel form which are provided in a series form across the power supply voltage $V_{cc}$ and ground potential GND of the circuitry. In this embodiment, although no special restriction is intended, the two P-channel MOSFETs and two N-channel MOSFETs constituting the CMOS NOR gate circuit NOG1 are constructed of the second and third P-channel MOSFETs provided in the PMOS region PM1 of the basic cell BC2, and the second and third N-channel MOSFETs provided in the NMOS region NM1.

Figure 6B:
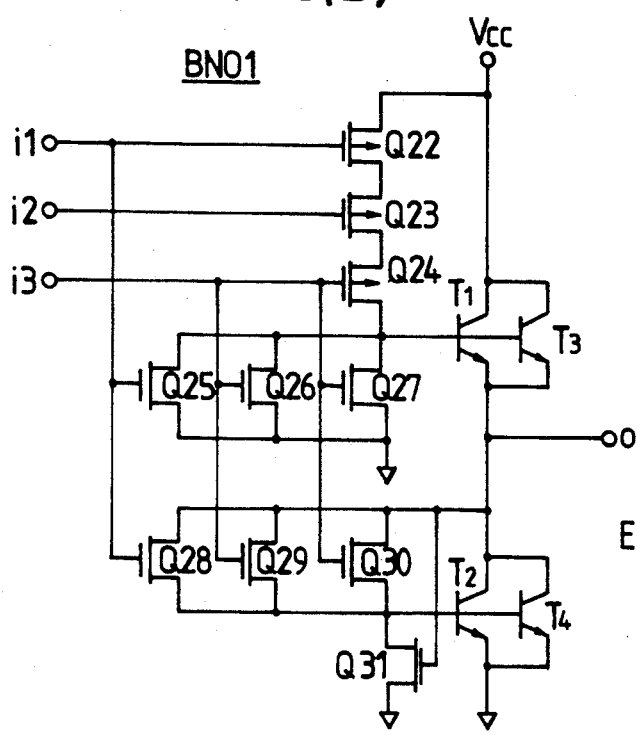
FIG. 6(b) is a circuit diagram of a Bi-CMOS NOR circuit in FIG. 3.

As shown in FIG. 6(b), the Bi-CMOS NOR gate circuit BNO1 is basically constructed of two output transistors T1 and T2 which are provided in a totem pole form across the power supply voltage $V_{cc}$ and ground potential GND of the circuitry. Three P-channel MOSFETs Q22–Q24 and three N-channel MOSFETs Q25–Q27 which constitute a CMOS NOR gate circuit are provided at a stage preceding the output transistor T1, and three N-channel MOSFETs Q28–Q30 whose source-drain paths are held in a parallel form are provided across the collector and base of the output transistor T2. In addition, one N-channel MOSFET Q31 whose gate is coupled to the collector of the output transistor T2 is provided across the base of the output transistor T2 and the ground potential GND of the circuitry. The transistors T1 and T2 and the MOSFETs Q22 thru Q31 are constructed of circuit elements provided in the bipolar transistor regions BT1 and BT2 and the PMOS region PM3 and NMOS regions NM3 thru NM5 of the basic cell BC2. In the embodiment in FIG. 3, the fan-out "fo" of the Bi-CMOS NOR gate circuit BNO1 is set at 8, so that the output transistors T1 and T2 are respectively provided with a pair of output transistors T3 and T4 in a parallel form. Needless to say, these transistors T3 and T4 are constructed of the pair of bipolar transistors provided in the bipolar transistor regions BT3 and BT4 of the basic cell BC2.

FIG. 9 shows a connection state in the case where the logic circuit in FIG. 3 is arranged using two of the basic cells BC illustrated in FIG. 8. Power supply wiring lines $V_{cc}$ and GND shown in FIG. 9 can be formed of a first layer of aluminum wiring. In addition, the connections of the circuit elements can be done using the first layer of aluminum wiring, a second layer of aluminum wiring, etc.

Figure 6C:
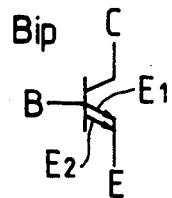
FIG. 6(c) is a diagram of a modification of a bipolar transistor.

Although, in the above, there has been described the example in which the bipolar transistors T1 and T3 (T2 and T4) are individually formed and are connected in parallel, it can be modified as shown in FIG. 6(c). That is, a single bipolar transistor Bip may well be provided with two emitters E1 and E2, which are coupled in common.

Figure 6D:
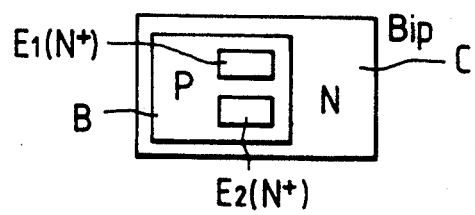
FIG. 6(d) is a plan view of the device in FIG. 6(c)

FIG. 6(d) shows an example of the layout of the bipolar transistor Bip in FIG. 6(c). As seen from FIG. 6(d), the bipolar transistor Bip can be formed including a P-type base region B which is formed in an N-type collector region C, and two N+-type emitter regions E1 and E2 which are dividedly formed in the base region B.

As thus far described, the gate array of this embodiment includes a plurality of basic cells BC which are laid out in a checkered pattern. Each of these basic cells BC includes two first cells each of which can construct a 3-input CMOS logic gate circuit or the combination of a 2-input CMOS logic gate circuit and a CMOS inverter circuit (in other words, a 1-input CMOS logic gate circuit) which correspond to the 3-input CMOS logic gate circuit, and one second cell which can construct a 2-input or 3-input Bi-CMOS logic gate circuit or a Bi-CMOS inverter circuit (in other words, a 1-input Bi-CMOS logic gate circuit). In addition, each basic cell BC includes a pair of bipolar transistors which are selectively used when a comparatively high drivability is required of the Bi-CMOS logic gate circuit.

Figure 7:
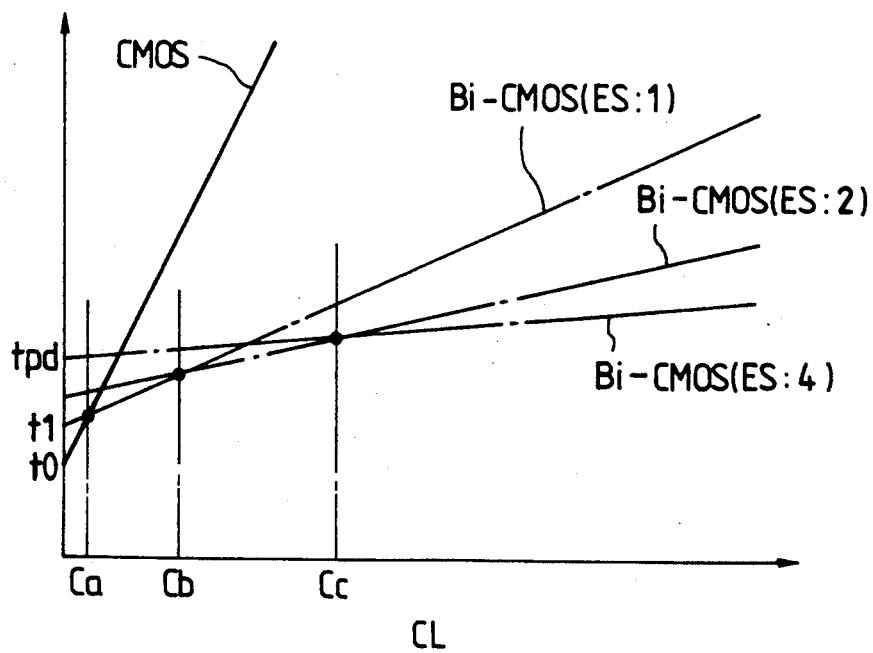
FIG. 7 is a graph showing the relationships between the load capacitances and propagation delay times of a CMOS logic gate circuit and Bi-CMOS logic gate circuits.

As illustrated in FIG. 7, the propagation delay time $t_{pd}$ of the CMOS logic gate circuit becomes shorter as compared with that of the Bi-CMOS logic gate circuit when the fan-out "fo" thereof is small to involve a comparatively low load capacitance CL, and it conversely becomes longer as compared with that of the Bi-CMOS logic gate circuit when a comparatively high load capacitance CL is involved. On the other hand, the propagation delay time $t_{pd}$ of the Bi-CMOS logic gate circuit presents a similar load-dependency as the emitter size ES of the output transistor thereof is made smaller. In the logic circuit in FIG. 3, therefore, a logic gate circuit which requires a fan-out of only 1 or 2 and whose load capacitance CL may be lower than Ca by way of example, such as any of the inverter circuits N1–N3, either of the NAND gate circuits NAG-1–NAG2, or the NOR gate circuit NOG1, is constructed using the first cell of each basic cell BC, and a logic gate circuit which requires a fan-out of comparatively large value and whose load capacitance CL exceeds Cb by way of example, such as the NAND gate circuit BNA1 or the NOR gate circuit BNO1, is constructed using the second cell of each basic cell BC. Further, regarding a Bi-CMOS logic gate circuit such as the NOR gate circuit BNO1 which requires a fan-out of 8 and whose load capacitance CL exceeds Cc, each of the output transistors in the totem pole form is constructed using the two bipolar transistors in a parallel form, and the emitter sizes ES thereof are enlarged, whereby the drivabilities thereof are heightened.

The propagation delay time $t_{pd(MOS)}$ of the CMOS logic gate circuit is expressed by the following equation:

$$t_{pd(MOS)} = t_o + V_{LT} \cdot CL / I_D \quad (1)$$

where $V_{LT}$: logic threshold value,
$I_D$: drain current of a MOSFET,
$t_o$: delay time which is independent
of the load capacitance CL and which contains a function of $X/I_D$, X denoting a plus real number.

The mean propagation delay time $t_{pd(Bi\text{-}CMOS)}$ $[=(t_{pHL}+t_{pLH})/2]$ of the Bi-CMOS logic gate circuit is expressed by the following equation:

$$t_{pd(Bi\text{-}CMOS)} = t_1 + V_{LT} \cdot CL / (n \cdot \beta \cdot I_D) \quad (2)$$

where $V_{LT}$: logic threshold value,
$I_D$: drain current of a MOSFET,
$\beta$: grounded-emitter current gain of a bipolar transistor,
$t_1$: delay time which is independent of the load capacitance CL and which is expressed by the sum between $Y(n)/2 \cdot I_D$ and $Z(n)/n \cdot \beta \cdot I_D$,
n: emitter area ratio in the case where an emitter area of, for example, $1 \times 3$ $\mu m^2$ is set as unity.

Here, Y(n) and Z(n) are expressed by the following equations:

$$Y(n) = V_{BE}(2 n\ C_{CB} + 2 n\ C_{BE} + C_{NS} + C_{PD}) + V_{LT} (4 n\ C_{CB} + 2\ C_{PD})$$

$$Z(n) = V_{LT}(n\ C_{sub} + C_{ND})$$

where $V_{BE}$: base-emitter voltage of the bipolar transistor, $C_{CB}$: collector-base capacitance of the bipolar transistor, $C_{BE}$: base-emitter capacitance of the bipolar transistor, $C_{sub}$: collector-substrate capacitance of the bipolar transistor, $C_{PD}$: drain capacitance of a P-MOSFET, $C_{ND}$: drain capacitance of an N-MOSFET, $C_{NS}$: source capacitance of the N-MOSFET.

Figure 12:
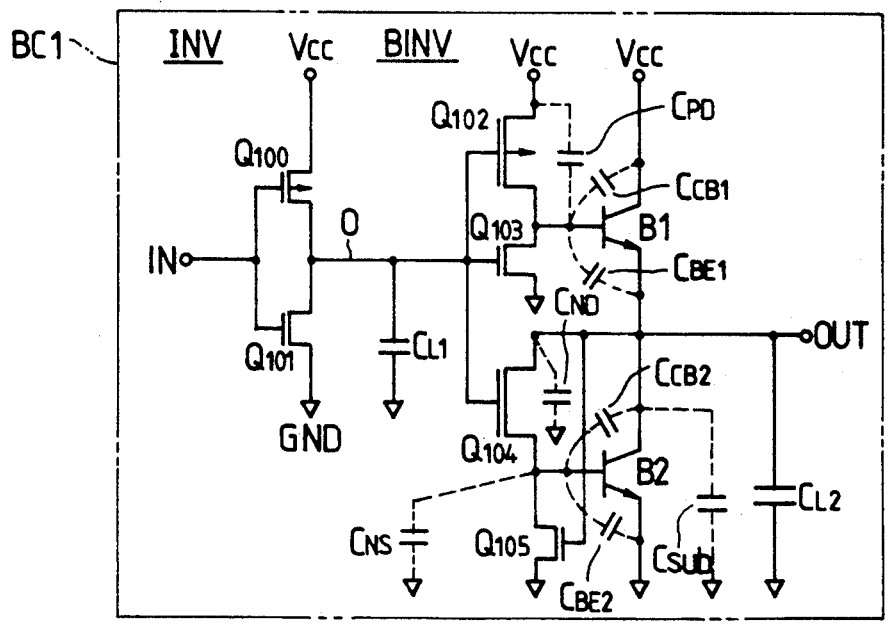
FIG. 12 is an explanatory diagram showing an example of use of MOSFETs and bipolar transistors which are included in the basic cell (BC1) shown in FIGS. 10 and 11.

These capacitances $C_{CB}$-$C_{NS}$ correspond to parasitic capacitances $C_{CB1}$-$C_{NS}$ which are indicated in FIG. 12 to be referred to later. In the above, the capacitance $C_{CB}$ corresponds to $C_{CB} = C_{CB1} = C_{CB2}$, and the capacitance $C_{BE}$ corresponds to $C_{BE} = C_{BE1} = C_{BE2}$.

By the way, set conditions are an ambient temperature $T_a = 25°$ C. and the power supply voltage $V_{cc} = 5$ V. Each MOSFET is formed by, for example, the 1.3 μm-process, with its gate length set at 1.2 μm and its gate width at 30 μm. On the other hand, each bipolar transistor has its emitter area set at $1 \times 3$ μm$^2$, its cutoff frequency set at 7 GHz, and its grounded-emitter current gain set at 100.

As understood from Eq. (1) mentioned above, regarding the propagation delay time $t_{pd(MOS)}$ of the CMOS circuit, the gradient thereof ($V_{LT}$CL/$I_D$) decreases as the drain current $I_D$ or conductance $g_m$ of the MOSFET increases. Meanwhile, as understood from Eq. (2), regarding the propagation delay time $t_{pd(Bi\text{-}CMOS)}$ of the Bi-CMOS circuit, the gradient thereof ($V_{LT}$CL/n·β·$I_D$) decreases as the emitter area ratio n of the bipolar transistor increases. Herein, the gradient in the case of n=2 (Bi-CMOS (ES:2)) becomes ½ of the gradient in the case of n=1, and the gradient in the case of n=4 (Bi-CMOS (ES: 4)) becomes ¼ of the gradient in the case of n=1.

Further, in Eq. (1), the delay time $t_o$ independent of the load capacitance CL decreases with increase in the drain current $I_D$. In Eq. (2), the delay time $t_1$ independent of the load capacitance CL increases with increase in the emitter area ratio n as indicated in FIG. 7.

Thus, the kind of a logic circuit to be used in the gate array according to this invention is determined by the graph of the propagation delay times $t_{pd}$—versus—load capacitances CL of a CMOS circuit, a first Bi-CMOS circuit whose emitter area ratio is one, and a second Bi-CMOS circuit whose emitter area ratio is greater than one, the graph being obtained from the device parameters of the P-channel and N-channel MOSFETs and those of the bipolar transistors fabricated in the gate array. That is, one logic circuit of the kind capable of charging and discharging its load capacitance CL fastest is selected from among the CMOS circuit, first Bi-CMOS circuit and second Bi-CMOS circuit with reference to the graph of the propagation delay times $t_{pd}$—versus—load capacitances CL.

In the actual design of the gate array, for each of various logic circuits such as an inverter circuit, a 2-input NOR circuit, a 2-input NAND circuit, a 3-input NOR circuit and a 3-input NAND circuit, the relationships of the propagation delay times $t_{pd}$—versus—load capacitances CL of the CMOS circuit, first Bi-CMOS circuit and second Bi-CMOS circuit which realize the corresponding logic circuit are found. Then, the value of the load capacitance CL of the logic circuit noticed is calculated, and the optimal circuit form is selected on the basis of the relationship of the propagation delay time $t_{pd}$—versus—load capacitance CL of the corresponding logic circuit and the calculated value of the load capacitance CL.

Thus, the gate array of this embodiment has the circuit elements of each basic cell BC utilized without waste, whereby the utilization factor of the elements is enhanced, with the result that a higher density of integration is attained. Moreover, the CMOS logic gate circuit or the Bi-CMOS logic gate circuit is efficiently selected according to the drivability required of each logic gate circuit, and the drivabilities of the Bi-CMOS logic gate circuits are changed-over stepwise, whereby the propagation delay time $t_{pd}$ is optimized. As the result, the operating speed of the logic circuit or the like constructed of the gate array is raised.

As indicated by the above embodiment, the following effects are attained by applying this invention to a gate array:

(1) The basic cell of the gate array includes at a predetermined ratio, one or more first cells which are used basically for constructing a CMOS logic gate circuit and one or more second cells which are used basically for constructing a Bi-CMOS logic gate circuit, and it includes a pair of bipolar transistors which are selectively used when a comparatively high drivability is required of the Bi-CMOS logic gate circuit. This brings forth the effect that, according to drivabilities required of the respective logic gate circuits, the CMOS logic gate circuit and the Bi-CMOS logic gate circuit can be constructed efficiently without waste.

(2) In the above item (1), according to the drivability required of the Bi-CMOS logic gate circuit, the bipolar transistors are connected in parallel with the output transistors of the circuit, thereby to bring forth the effect that the arrangement and drivability of the Bi-CMOS logic gate circuit can be optimized.

(3) Owing to the above items (1) and (2), there is brought forth the effect that the number of circuit elements of the gate array can be virtually reduced to heighten the density of integration thereof.

(4) Owing to the above items (1) and (2), there is brought forth the effect that the propagation delay time of a logic circuit or the like constructed of the gate array can be shortened to raise the operating speed thereof.

In the foregoing embodiment, the single basic cell BC including the four bipolar transistors BT1–BT4 has been chiefly described. However, this invention is not restricted thereto, but it can achieve similar effects by contriving the layout of a single basic cell including two bipolar transistors. Incidentally, although some of reference symbols in the drawings to be referred to below agree with the reference symbols assigned to FIGS. 1 thru 9, it is to be understood that they are not identical.

Figure 10:
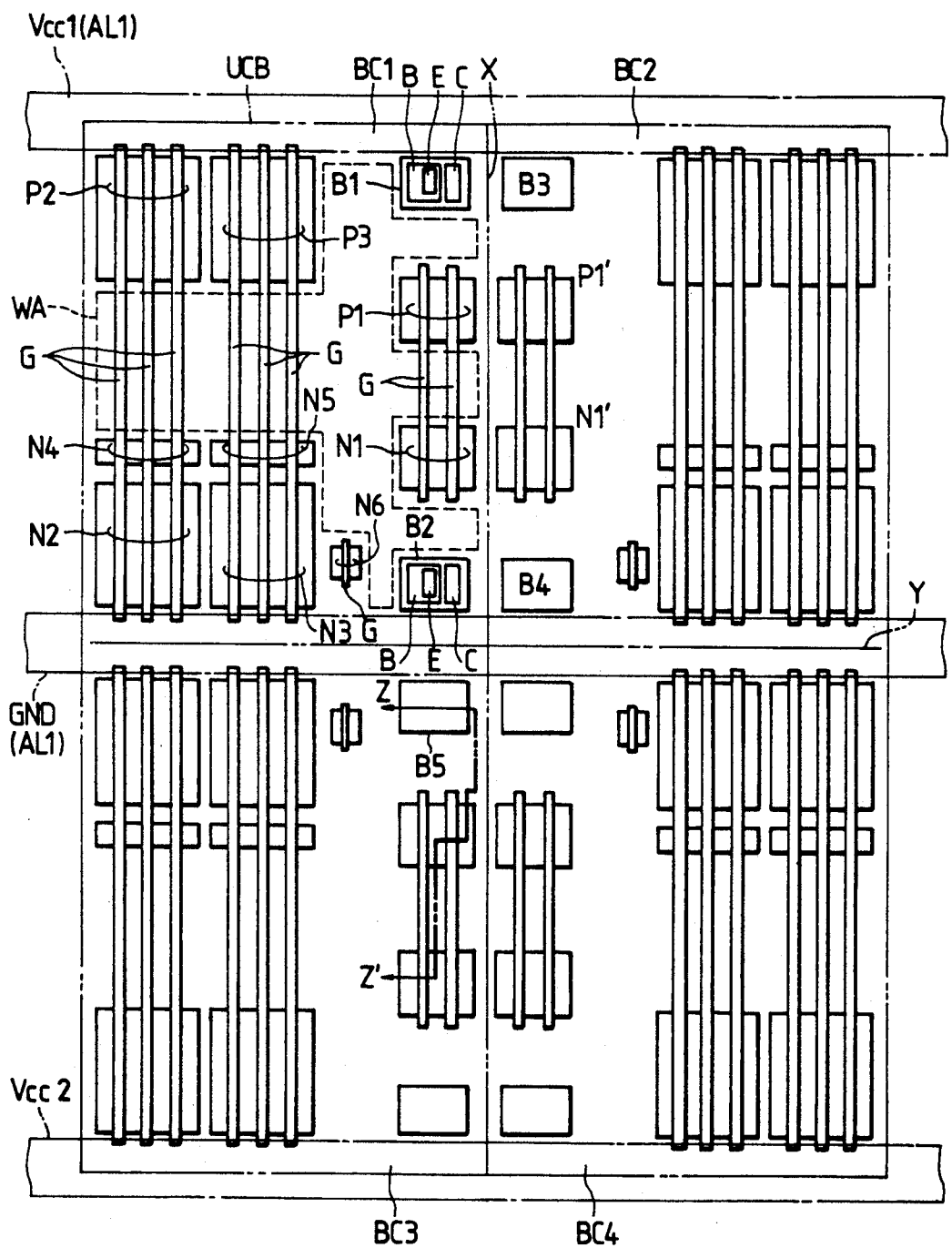
FIG. 10 is a layout diagram of basic cells (BC1-BC4)

FIG. 10 shows another embodiment of this invention, and is a diagram of the optimal layout of four basic cells BC1–BC4 each including two bipolar transistors. The features of the basic cell BC1 shown in FIG. 10 will be explained before the description of the features of the layout of the basic cells BC1–BC4 shown in the figure.

Figure 11:
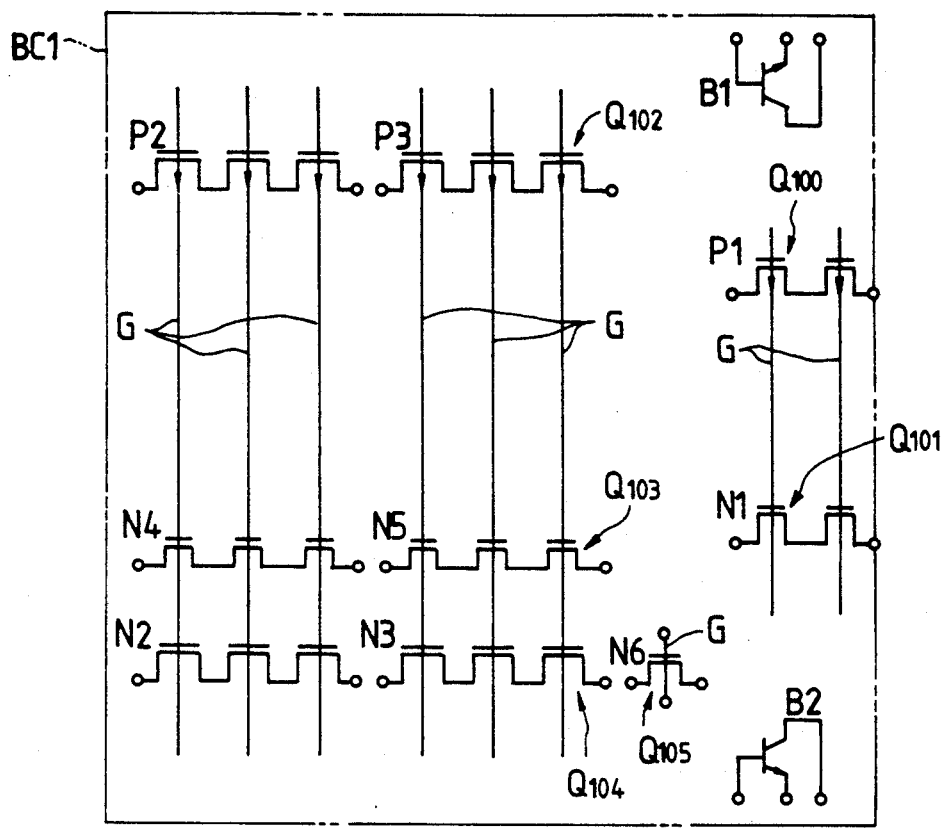
FIG. 11 is an equivalent circuit diagram of the basic cell (BC1) in FIG. 10.

The basic cell BC1 includes two bipolar transistors B1 and B2, a P-channel MOSFET region P1 and an N-channel MOSFET region N1 which are arranged between the bipolar transistors B1 and B2, and P-channel MOSFET regions P2 and P3 and N-channel MOSFET regions N2–N6. Two gate electrodes G made of polycrystalline silicon are formed in the region P1, and they are extended onto the region N1. As a result, two P-MOSFETs are formed in the region P1, and two N-MOSFETs in the region N1. Besides, three gate electrodes made of polycrystalline silicon are respectively formed in the regions P2 and P3, and they are respectively extended onto the regions N2, N4 and the regions N3, N5. As a result, three P-MOSFETs are formed in each of the regions P2 and P3, and three N-MOSFETs in each of the regions N2, N3, N4 and N5. Further, in the region N6, a single gate electrode G made of polycrystalline silicon is formed, and a single N-MOSFET is formed. FIG. 11 shows an equivalent circuit diagram of the basic cell BC1.

Each of the MOSFETs formed in the regions P1 and N1 is endowed with a gate length of 1.2 μm and a gate width of 15 μm, while each of the MOSFETs formed in the regions P2, P3, N2 and N3 is endowed with a gate length of 1.2 μm and a gate width of 30 μm. Accordingly, the drivability of each of the P- and N-channel MOSFETs in the regions P1 and N1 becomes lower than that of each of the P- and N-channel MOSFETs in the regions P2 and N2 or the regions P3 and N3. By way of example, let's consider a case where a circuit arrangement shown in FIG. 12 is formed using MOSFETs indicated at $Q_{100}$–$Q_{105}$ and bipolar transistors indicated at B1–B2 in FIG. 11. A COMS inverter INV is configured of the P-MOSFET $Q_{100}$ and N-MOSFET $Q_{101}$ whose gate widths are made small. Meanwhile, a Bi-CMOS inverter circuit BiNV has its input driven by the output of the CMOS inverter INV. The Bi-CMOS inverter circuit BINV includes the bipolar output transistors B1 and B2 in a totem pole form, a CMOS inverter configured of the P-MOSFET $Q_{102}$ and N-MOSFET $Q_{103}$ for driving the base of the bipolar transistor B1, and the N-MOSFETs $Q_{104}$ and $Q_{105}$ for driving the base of the bipolar transistor B2.

The P-MOSFET $Q_{102}$ having the large gate width is employed as a P-MOSFET whose source-drain path is coupled across a power supply terminal $V_{cc}$ and the base of the bipolar transistor B1. Since this P-MOSFET $Q_{102}$ has the high drivability, it quickly charges capacitances parasitic to the base electrode of the bipolar transistor B1, namely, the base-collector capacitance $C_{CB1}$ and base-emitter capacitance $C_{BE1}$ of the bipolar transistor B1 and the drain capacitance $C_{PD}$ of the P-MOSFET $Q_{102}$. The output rise delay time $t_{pLH}$ of the Bi-CMOS circuit contains a term $$(\frac{V_{LT}}{\beta \cdot I_{PD}} \cdot CL2$$

where $V_{LT}$ denotes a logic threshold value) which is inversely proportional to the product between the grounded-emitter current gain $\beta$ of the bipolar transistor B1 and the drain current $I_{PD}$ of the P-MOSFET $Q_{102}$ and which is proportional to the load capacitance CL of the Bi-CMOS circuit, and a term ($A/I_{PD}$ where A denotes a plus real number) which is inversely proportional to the drain current $I_{PD}$. Accordingly, the output rise delay time $t_{pLH}$ is shortened by increasing the drain current $I_{PD}$ of the P-MOSFET $Q_{102}$, that is, by enlarging the gate width of the P-MOSFET $Q_{102}$.

On the other hand, the N-MOSFET $Q_{104}$ having the large gate width is employed as an N-MOSFET whose source-drain path is coupled across an output terminal Out and the base of the bipolar transistor B2. Since this N-MOSFET $Q_{104}$ has the high drivability, it quickly charges capacitances parasitic to the base electrode of the bipolar transistor B2, namely, the base-collector capacitance $C_{CB2}$ and base-emitter capacitance $C_{BE2}$ of the bipolar transistor B2 and the source capacitance $C_{NS}$ of the N-MOSFET $Q_{104}$. The output fall delay time $t_{pHL}$ of the Bi-CMOS circuit contains $$\frac{V_{TL}}{\beta \cdot I_{ND}} \cdot CL2$$

(where $\beta$ denotes the grounded-emitter current gain of the bipolar transistor B2, and $I_{ND}$ denotes the drain current of the N-MOSFET $Q_{104}$) and $B/I_{ND}$ (where B denotes a plus real number). Accordingly, the output fall delay time $t_{pHL}$ is shortened by increasing the drain current $I_{ND}$ of the N-MOSFET $Q_{104}$, that is, by enlarging the gate width of the N-MOSFET $Q_{104}$. By the way, the aforementioned numbers A and B can be expressed by functions of the parasitic capacitances $C_{CB1}$, $C_{BE1}$, $C_{PD}$, $C_{NS}$, $C_{CB2}$ and $C_{BE2}$, the logic threshold value $V_{LT}$, the grounded-emitter current gains $\beta$, the collector-substrate capacitance $C_{sub}$ of the bipolar transistor B2, and the drain capacitance $C_{ND}$ of the N-MOSFET $Q_{104}$.

Meanwhile, the N-MOSFET $Q_{103}$ provided across the base electrode of the bipolar transistor B1 and a ground potential GND and the N-MOSFET $Q_{105}$ provided across the base electrode of the bipolar transistor B2 and the ground potential GND serve to discharge the capacitances parasitic to the corresponding base electrodes, and hence, the gate widths thereof may well be small.

As understood from FIG. 12, the output O of the CMOS inverter INV drives only the input of the Bi-CMOS inverter circuit BINV formed in the same basic cell BC1. Therefore, when the output load capacitance CL2 of the Bi-CMOS inverter circuit BINV is assumed to be a large value, the output load capacitance CL1 of the CMOS inverter INV is regarded as being smaller than the value of the capacitance CL2. Thus, the load capacitance CL1 of the CMOS inverter INV is low, so that the propagation delay time $t_{pd}$ of the CMOS inverter INV can be regarded as being determined by the part of the CMOS characteristic smaller than Ca in the load capacitance CL illustrated in FIG. 7. In other words, since the output load capacitance CL1 of the CMOS inverter INV is low, the propagation delay time $t_{pd}$ thereof is regarded as being permissively short even when the drivabilities of the P- and N-channel MOSFETs constituting the CMOS inverter INV are set low, that is, the gate widths thereof are made small. Stated differently, a circuit design is done so that the CMOS circuit constructed of the MOSFETs of the small gate widths formed in the regions P1 and N1 may be positively applied to a circuit part of low output load capacitance CL, whereby the propagation delay time characteristic of the CMOS circuit is effectively utilized.

In this manner, the plurality of MOSFETs each having the small gate width are positively assembled in the basic cell BC1, and the use of the CMOS circuit formed of these MOSFETs is specified, whereby the optimal design concerning the propagation delay time is done. Further, the MOSFETs of the small gate widths are arranged in the regions between the bipolar transistors B1 and B2 within the basic cell BC1, whereby the occupation area of the basic cell BC1 is effectively utilized.

Since the basic cell BC1 is formed so as to be suitable for a gate array of the type having no wiring channel, a wiring area WA is provided in the basic cell BC1 as indicated by a dotted line in FIG. 10. As wiring which is laid in the basic cell bC1, it is desirable to chiefly utilize a first layer of aluminum wiring (AL1) and/or polycrystalline silicon wiring. The reason is that, as shown in FIG. 10, a power supply voltage line $V_{cc}$ and a ground potential line GND which are formed of the first layer of aluminum wiring (AL1) are extended at the upper and lower parts of the basic cell BC1. Further, in a case where a signal input line to the basic cell BC1 and a signal output line from the basic cell BC1 intersect the power supply voltage line $V_{cc}$ or the ground potential line GND, the input/output lines are formed of a second layer of aluminum wiring. In a case where the input/output lines do not intersect the $V_{cc}$ line or the GND line, that is, in a case where they are laid so as to orthogonally intersect the polycrystalline-silicon gate electrodes formed in the basic cell BC1, they are formed of the first layer of aluminum wiring and/or polycrystalline silicon wiring.

Next, contrivances for the layout of the various elements in the basic cell BC1 will be described with reference to FIG. 10. The bipolar transistors B1 and B2 are arranged at the upper and lower parts of the basic cell BC1 so as to be readily connected to the power supply line $V_{cc}$ and the ground line GND. Thus, the connection between the collector C of the bipolar transistor B1 and the power supply line $V_{cc}$ and the connection between the emitter E of the bipolar transistor B2 and the ground line GND are effected with short distances, so that the collector parasitic resistance of the bipolar transistor B1 and the emitter parasitic resistance of the bipolar transistor B2 attributed to connection wiring are lowered. Likewise, the regions P2, P3 and the regions N2, N3 where the MOSFETs of the enlarged gate widths are provided are arranged near the power supply line $V_{cc}$ and the ground line GND. Thus, in a case where a CMOS circuit is formed using the MOSFETs of the regions P2, P3, N2 and N3, the connection between the source region of each of the MOSFETs and the power supply line $V_{cc}$ or the ground line GND can be effected with a short distance, and hence, the source resistance of each MOSFET is lowered. Further, it will be noted that the region P2 (P3), region N4 (N5), region N2 (N3) and region N6 are laid out so as to resemble the connectional relation of the transistors $Q_{102}-Q_{105}$ of the Bi-CMOS inverter BINV shown in FIG. 12. This layout facilitates the design of wiring based on the CAD (computer aided design) in the case of constructing a Bi-CMOS logic circuit. Still further, the wiring area WA virtually lengthens the distances between the P-MOSFET forming regions P1, P2 and P3 and the N-MOSFET forming regions N1–N6. Accordingly, the prevention of the latch-up phenomenon becomes possible. Besides, the wiring area WA is interposed between the bipolar transistor B1 and the regions P1 and P2 and between the bipolar transistor B2 and the regions N1, N2 and N6. Thus, even when minority carriers have been injected into a substrate by the saturation of the bipolar transistor B1 or B2, the MOSFETs are little affected owing to the presence of the wiring area WA. In addition, the base electrodes B of the respective bipolar transistors B1 and B2 are provided in directions in which the regions P3 (P2), N6 and N3 (N2) exist, in order that they may be readily connected with the MOSFETs coupled thereto.

Next, contrivances for the layout of the basic cells BC1-BC4 will be described with reference to FIG. 10. The basic cells BC1 and BC2 are held in mirror symmetry with respect to a two-dot chain line X drawn in the figure. As a result, the bipolar transistors B1, B2 in the basic cell BC1 and bipolar transistors B3, B4 in the basic cell BC2 are arranged in proximity. Further, the basic cells BC1, BC2 and those BC3, BC4 are held in mirror symmetry with respect to a two-dot chain line Y drawn in the figure. These four basic cells BC1-BC4 are regarded as a unit cell block UCB. Such unit cell blocks UCB are laid out regularly in a checkered pattern in the internal logic circuit-forming region of the semiconductor substrate SUB, whereby the master chip of the gate array is fabricated. Owing to the mirror symmetry of the basic cells BC1, BC2 and those BC3, BC4 with respect to the two-dot chain line Y, MOSFETs and bipolar transistors in the respective basic cells to be connected to the ground line GND are gathered up to the middle part of the unit cell block UCB, namely, the part thereof extending along the two-dot chain line Y. Accordingly, in a case where the ground line GND is formed along the line Y as illustrated in the figure, one ground line GND can be shared by the two basic cells BC1 and BC3 (BC2 and BC4), and hence, the required number of the ground lines GND decreases. Power supply lines $V_{cc1}$ and $V_{cc2}$ are respectively arranged at the upper and lower parts of the unit cell block UCB as shown in the figure. This arrangement can prevent the mutual conductance $g_m$ from lowering due to the passing of the power supply wiring on the MOSFETs. The power supply lines $V_{cc1}$, $V_{cc2}$ and the ground line GND are formed of the first layer of aluminum wiring AL1.

Next, an example of the form of utilization of the basic cells BC1 and BC2 shown in FIG. 10 will be described with reference to FIGS. 13(a) and 13(b).

Figure 13A:
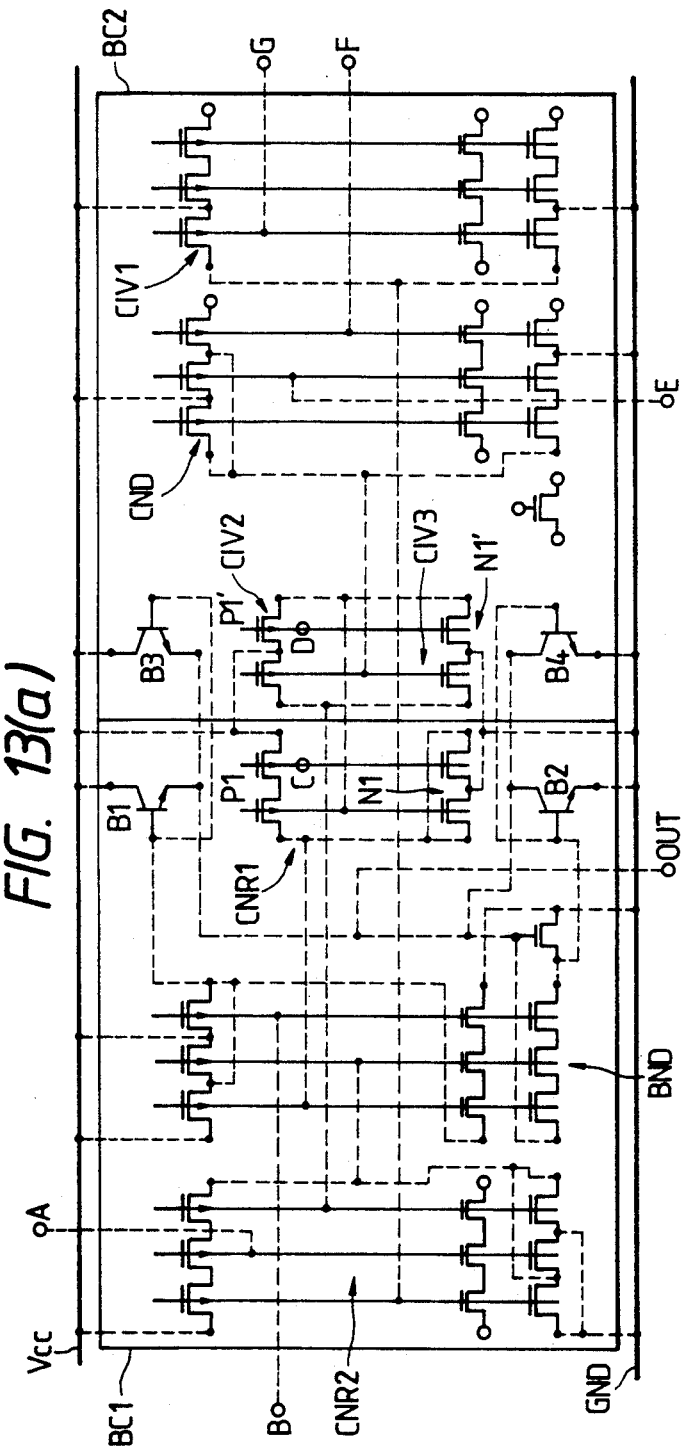
FIG. 13(a) is a diagram showing an example of the connection of the basic cells (BC1, BC2) in FIG. 10.
Figure 13B:
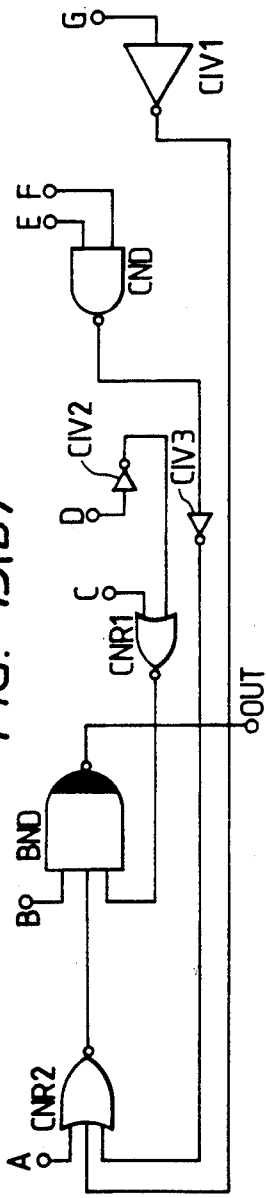
FIG. 13(b) is a diagram showing a circuit arrangement which is formed of the basic cells (BC1, BC2) shown in FIG. 13(a)

FIG. 13(a) exemplifies a case where a circuit arrangement in FIG. 13(b) is realized using the P- and N-channel MOSFETs and bipolar transistors built in the basic cells BC1 and BC2. In the drawing, dotted lines indicate aluminum wiring and/or polycrystalline silicon wiring. Black circles indicate the nodes between the wiring and the gates of the MOSFETs and bipolar transistors, and the nodes between the wiring (including the $V_{cc}$ and GND lines) and the sources, drains, bases, emitters and collectors of the MOSFETs and bipolar transistors. In addition, letters A, B, C, D, E, F and G and a white circle "Out" denote signal input/output terminals. As regards FIG. 13(b), the concrete processing conditions of logic circuits and the logic conditions of various input and output signals are not directly pertinent to this invention, and they shall be omitted from detailed description. Besides, in FIG. 13(a), reference symbols correspond to parts where CMOS inverter circuits CIV1, CIV2, CIV3, a CMOS NAND circuit CND, CMOS NOR circuits CNR1, CNR2 and a Bi-CMOS NAND circuit BND shown in FIG. 13(b) are respectively formed, and they shall not be explained in detail. The features of the example will be described below.

As understood from FIG. 13(a), the input terminals A-F and G are connected to the gate electrodes in the basic cells BC1 and BC2 on the wiring areas WA (refer to FIG. 10) of these basic cells. In addition, the output terminal "Out" is derived from the wiring formed in the wiring area WA. Thus, signal delay times ascribable to input/output wiring resistances are suppressed to the utmost. In order to avoid the complicacy of the drawing, input wiring is not illustrated for the inputs C and D.

Further, since the CMOS inverter circuits CIV-1–CIV3 and the CMOS NAND circuit CND are constructed in the basic cell BC2, the bipolar transistors B3 and B4 in the basic cell BC2 are not used for the above CMOS circuits CIV1-CIV3 and CND fabricated in this basic cell BC2. However, the bipolar transistors B1 and B3 (B2 and B4) in both the basic cells BC1 and BC2 are laid out in proximity owing to the mirror symmetry of these basic cells with respect to the line X as shown in FIG. 10, so that the parallel connection of the bipolar transistors B1 (B2) and B3 (B4) is permitted with a small wiring length as illustrated in FIG. 13(a). By the way, a case where the fan-out number of the Bi-CMOS NAND circuit BND is large is assumed in FIG. 13(a), the parallel connection of the bipolar transistors B1 (B2) and B3 (B4) need not be done for a case of a small fan-out number.

Figure 13C:
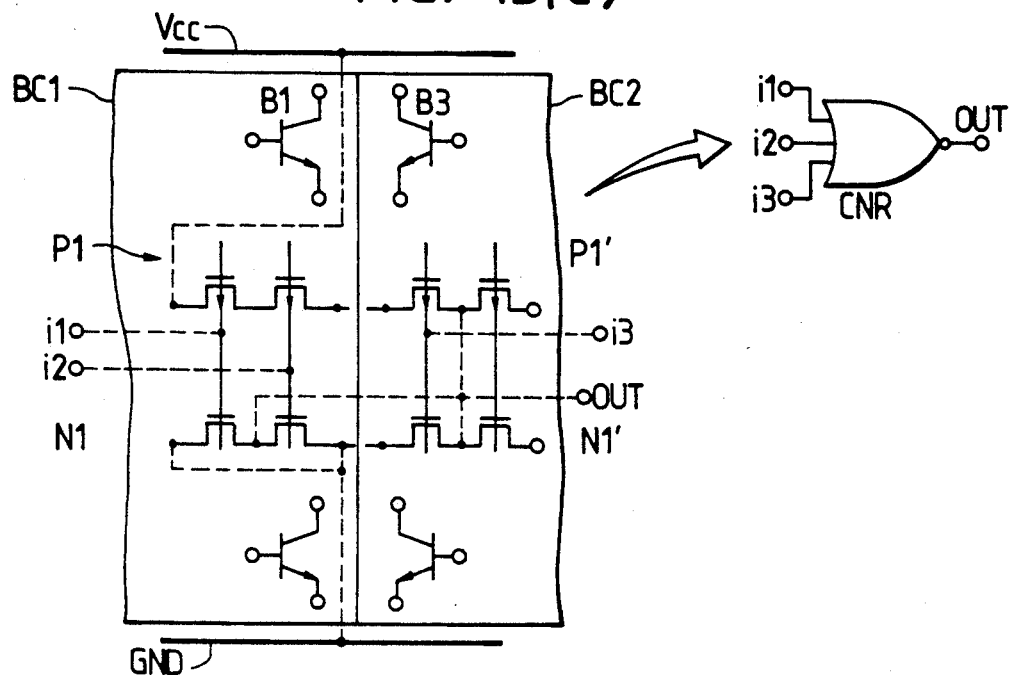
FIG. 13(c) is a connection diagram showing an example of usage of MOSFETs which are included in the basic cells (BC1, BC2)

Accordingly, the layout of the basic cells BC1 and BC2 shown in FIG. 10 makes it possible that semiconductor elements, such as MOSFETs and bipolar transistors, not used in one basic cell are utilized as part of a circuit which is constructed in the other basic cell. In other words, one logic circuit can be formed of the semiconductor elements in one basic cell and semiconductor elements in the other basic cell. Thus, the effective utilization of the semiconductor elements in the basic cells is realized. Although the bipolar transistors B1-B4 have been referred to in the above, the same applies to MOSFETs which are formed in regions P1, N1, P1' and N1'. Such an example is shown in FIG. 13(c). This figure illustrates a case where a 3-input CMOS NOR circuit CRN is formed using P- and N-channel MOSFETs formed in the regions P1, N1, P1' and N1'.

Referring to FIG. 13(a) again, the output of the CMOS inverter circuit CIV1 drives the input of the CMOS NOR circuit CNR2 of the basic cell BC1. That is, the output wiring of the CMOS inverter circuit CIV1 is extended from the right end of the basic cell BC2 to the left end of the basic cell BC1, and the output load capacitance CL thereof is thought to become comparatively high. Since, however, the CMOS inverter circuit CIV1 is configured of P-MOSFETs and N-MOSFETs of large gate widths, the propagation delay time thereof can be made comparatively short. The MOSFETs having the large gate widths can also be applied for such uses.

Figure 14:
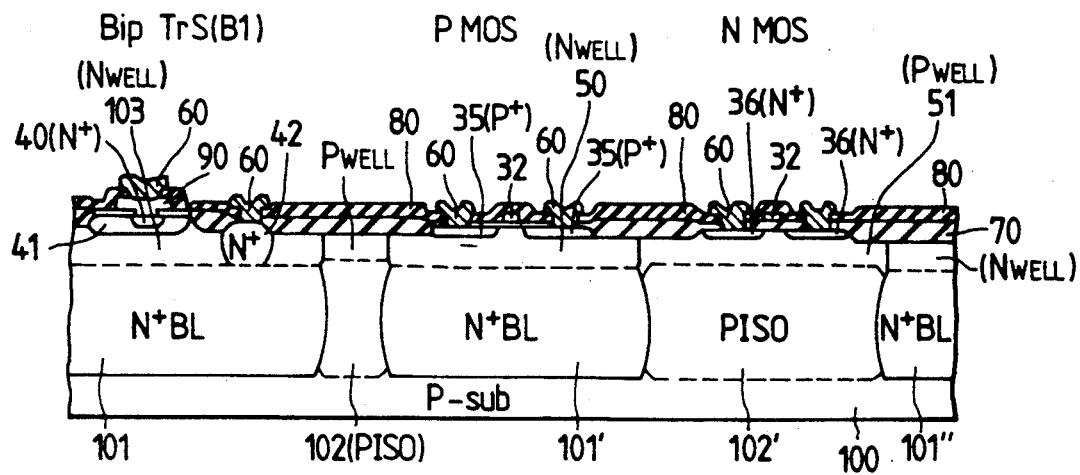
FIG. 14 is a sectional view of the device in FIG. 10 as taken along a plane Z - Z'.

FIG. 14 is a sectional view taken along the plane Z - Z' of the basic cell BC3 shown in FIG. 10. As shown in the drawing, this structure comprises the gates 32, n-well 50 and p-well 51 of MOSFET consisting of polysilicon, a P+ diffusion layer 35 as the source-drain of a P-MOSFET, an N+ diffusion layer 36 as the source-drain of an N-MOSFET, a diffusion layer 40 (serving as emitter: E) constituting a bipolar NPN transistor B5, a diffusion layer 41 (as base: B), and a diffusion layer 42 (as collector: C).

This structure can be manufactured using various known semiconductor manufacturing processes. For example, the P-type isolation regions 102 and 102' can be formed in the substrate 100 by diffusion of boron into the substrate, while the N+-type buried layer regions 101, 101' and 101" can be formed by diffusion of antimony into the substrate. Diffusion of these dopants at 1200° C. for 40 minutes, for example, can be used for initially forming these regions. Subsequently, an N− epitaxial layer can be formed over the substrate to cover the regions 101, 102, etc. by a conventional epitaxial deposition step (e.g. 970° C. for 10 minutes could be used). Next, N-type well regions 50 and 103 and P-type well 51 can be formed in the epitaxial region by ion implantation of phosphorus and boron, respectively. As an example, P-ion implantation can be carried out at 125 KeV with a dosage of $3 \times 10^{11}$ atoms/cm$^2$ using a Si$_3$N$_4$ mask followed by boron ion implantation at 60 KeV and a dosage of $4.0 \times 10^{13}$ atoms/cm$^2$ using a SiO$_2$ film mask (e.g. the Locos technique). The ion implantation step can then be followed by a diffusion step (e.g. 1000° C. $\times$ 300 minutes) to cause expansion of the respective regions 101, 102, etc. and the wells 50, 51 and 103 into one another to provide the structure shown in FIG. 14. Following this, the respective MOS and bipolar transistors can be formed in openings in the SiO$_2$ layer 70 using conventional transistor forming techniques. Finally, a PSG (phospho-silicate glass) film 80 can be deposited (e.g. at 480° C. for 10 minutes) over the device for protection.

Reference numeral 42 designates an N+-type layer which connects aluminum wiring 60 as a collector electrode and the N+-type buried layer 101 with a low resistance. Reference numeral 90 designates N+-type polycrystalline silicon, which is used for forming an N+-type emitter region. Aluminum wiring 60 formed in the P-MOSFET and N-MOSFET is used as source and drain electrodes. FIG. 14 corresponds to the section of the basic cell BC3 in which the aluminum wiring 60 has been laid.

In the above, the invention made by the inventors has been concretely described in conjunction with the embodiments. It is needless to say, however, that this invention is not restricted to the foregoing embodiments, but that it can be variously altered within a scope not departing from the purport thereof. By way of example, regarding FIG. 1, all the basic cells BC need not have the identical circuit arrangement. The ratio between the first cells and the second cell to be provided in each basic cell BC, the first cells including the PMOS regions PM1 and PM2 and the NMOS regions NM1 and NM2 while the second cell includes the PMOS region PM3, the NMOS regions NM3-NM5 and the bipolar transistor regions BT1-BT4, can be properly changed in correspondence with the ratio between CMOS logic gate circuits and Bi-CMOS logic gate circuits included in a logic circuit which is to be constructed using the gate array. In addition, the number of the P-channel MOSFETs or N-channel MOSFETs included in each PMOS region or NMOS region can be changed into any of 2, 4, etc. in correspondence with, for example, the mean input number of the logic gate circuits included in the logic circuit which is to be constructed using the gate array. The NMOS region NM5 may well be resistance means by way of example, and the number of the bipolar transistor regions may well be increased in a case where a still higher drivability is required of the Bi-CMOS logic gate circuit. In FIG. 2, the basic cells BC need not be especially laid out in the checkered pattern. Besides, the gate array may well locally include the basic cells BC as stated above. Regarding FIG. 3, the second cell of each basic cell BC may well be employed for constructing a CMOS logic gate circuit in a case where a Bi-CMOS logic gate circuit is not required. Further, various aspects of performance can be adopted for the construction of the basic cell BC shown in FIG. 1, the practicable circuit arrangements of the Bi-CMOS logic gate circuits shown in FIGS. 6(a) and 6(b), etc.

In the above description, the invention made by the inventors has been chiefly explained on the case of application to a logic circuit constructed of a Bi-CMOS gate array as forms the background field of utilization thereof, but it is not restricted to the logic circuit. By way of example, the invention can be also applied to various digital devices, such as microcomputers, constructed of similar gate arrays. This invention is extensively applicable to a gate array which is basically constructed of, at least, a CMOS logic gate circuit and a Bi-CMOS logic gate circuit, or a digital device which is constructed of such a gate array.

Effects which are attained by a typical aspect of performance of this invention are briefly explained as follows: A gate array is configured of a plurality of basic cells laid out in a checkered pattern, each of which includes at a predetermined ratio a first cell to be used basically for constructing a CMOS logic gate circuit and a second cell to be used basically for constructing a Bi-CMOS logic gate circuit, and each of which includes a pair of bipolar transistors to be selectively used when a comparatively high drivability is required of a Bi-CMOS logic gate circuit, whereby CMOS logic gate circuits and Bi-CMOS logic gate circuits optimalized according to drivabilities can be constructed efficiently without waste. Thus, the number of circuit elements of the gate array can be reduced, and the density of integration thereof can be heightened. Simultaneously, the propagation delay time of a logic circuit or the like constructed of the gate array can be shortened, and the operating speed thereof can be raised.

What is claimed is:

1. A logic circuit comprising:
   a first power supply terminal which is fed with a first power supply voltage;
   a second power supply terminal which is fed with a second power supply voltage lower than the first power supply voltage;
   an input terminal which receives an input signal;
   an output terminal which delivers an output signal;
   a first bipolar transistor which has an emitter-collector path coupled across said first power supply terminal and said output terminal;
   a second bipolar transistor which has an emitter-collector path coupled in parallel with the emitter-collector path of said first bipolar transistor, and a base coupled to a base of said first bipolar transistor;
   a third bipolar transistor which has an emitter-collector path coupled across said second power supply terminal and said output terminal;
   a fourth bipolar transistor which has an emitter-collector path coupled in parallel with the emitter-collector path of said third bipolar transistor, and a base coupled to a base of said third bipolar transistor; and
   a CMOS circuit which is coupled across said first and second power supply terminals;
   said CMOS circuit including an input coupled to said input terminal, a first output coupled to the base of said fist bipolar transistor, a second output coupled to the base of said third bipolar transistor, a P-MOSFET having a gate coupled to said input and a source-drain path coupled across said first power supply terminal and said first output, and an N-MOSFET having a gate coupled to said input and a source-drain path coupled across said output terminal and said second output.

2. A basic cell for use in a semiconductor integrated circuit device on a semiconductor substrate comprising:
   a pair of bipolar transistors;
   a first P-channel MOSFET having a first gate width;
   a first N-channel MOSFET having a second gate width;
   a second P-channel MOSFET having a third gate width larger than the first gate width;
   a second N-channel MOSFET having a fourth gate width larger than the second gate width; and
   a third N-channel MOSFET having a fifth gate width smaller than the fourth gate width,
   wherein the first P- and N-channel MOSFETs are arranged at a first area between the pair of bipolar transistors,
   wherein the first P- and N-channel MOSFETs have gate electrodes, respectively, which extend along a predetermined line;
   wherein the second P- and N-channel MOSFETs are arranged at a second area adjacent to the pair of bipolar transistors and the first area, and have gate electrodes which extend along a predetermined line, and
   wherein the third N-channel MOSFET is arranged in the second area and adjacent to both one of the pair of bipolar transistors and the second N-channel MOSFET, and wherein the third N-channel MOSFET has a gate electrode.

3. A basic cell according to claim 2, wherein a plurality of the second P- and N-channel MOSFETs are provided at the second area, and wherein a plurality of the first P- and N-channel MOSFETs are provided in the first area.

4. A basic cell according to claim 3, wherein the pair of bipolar transistors are of an NPN type.

5. A basic cell according to claim 2, wherein the gate electrodes of the first P- and N-channel MOSFETs are connected to each other to form a first common gate, and wherein the gate electrodes of the second P- and N-channel MOSFETs are connected to each other to form a second common gate.

6. A basic cell according to claim 5, wherein the first common gate of the first P- and N-channel MOSFETs and the second common gate of the second P- and N-channel MOSFETs and the gate electrode of the third N-channel MOSFET extend in a predetermined direction.

7. A basic cell according to claim 6, wherein a plurality of the first P- and N-channel MOSFETs are provided in the first area, and wherein a plurality of the second P- and N-channel MOSFETs are provided in the second area.

8. A basic cell according to claim 7, wherein the pair of bipolar transistors are of an NPN type.

9. A basic cell according to claim 2, further comprising: a fourth N-channel MOSFET, wherein the fourth N-channel MOSFET is arranged in the second area and between the second P- and N-channel MOSFETs,
   and wherein a gate electrode of the fourth N-channel MOSFET and the gate electrodes of the first P- and N-channel MOSFETs extend along a predetermined line.

10. A basic cell according to claim 9, wherein the gate electrodes of the first P- and N-channel MOSFETs are connected to each other to form a first common gate, and wherein the gate electrodes of the second P- and N-channel MOSFETs and fourth N-channel MOSFET are connected to each other to form a second common gate.

11. A basic cell according to claim 10, wherein the first common gate of the first P- and N-channel MOSFETs, the second common gate of the second P-channel MOSFET and second and fourth N-channel MOSFETs, and the gate electrode of the third N-channel MOSFET extend in a predetermined direction.

12. A basic cell according to claim 11, wherein a plurality of the first P- and N-channel MOSFETs are provided in the first area, and wherein a plurality of the second P- and N-channel MOSFETs and the third N-channel MOSFET are provided in the second area.

13. A basic cell according to claim 12, wherein the pair of bipolar transistors are of an NPN type.

14. In a semiconductor integrated circuit device formed on a semiconductor chip and including a plurality of basic cells, a layout arrangement of the basic cell comprising:
 a first area in which a first bipolar transistor is formed;
 a second area in which a second bipolar transistor is formed;
 a third area disposed between the first and second areas in which first and second n-channel MOSFETs, each having a first predetermined gate width, are formed on a first N-type diffusion layer, and in which third and fourth p-channel MOSFETs, each having a second predetermined gate width, are formed on a first P-type diffusion layer; and
 a fourth area abutting the first to third areas in which fifth to seventh N-channel MOSFETs are formed on a second N-type diffusion layer and in which eighth to tenth N-channel MOSFETs are formed on a third N-type diffusion layer and in which eleventh to thirteenth P-channel MOSFETs are formed on a second P-type diffusion layer and in which fourteenth to sixteenth P-channel MOSFETs are formed on a third P-type diffusion layer, each of said fifth to tenth N-channel MOSFETs having a third predetermined gate width larger than the first predetermined gate width, and each of said eleventh to sixteenth P-channel MOSFETs having a fourth predetermined gate width larger than the second predetermined gate width.

15. The basic cell according to claim 14, wherein the first, second and fifth to tenth N-channel MOSFETs and the third, fourth and eleventh to sixteenth P-channel MOSFETs have gate electrodes which extend in the same direction.

16. A basic cell according to claim 15, wherein the gate electrodes of the first and second N-channel MOSFETs are connected to the third and fourth P-channel MOSFETs, respectively, and wherein the gate electrodes of the fifth to tenth N-channel MOSFETs are connected to the gate electrodes of the eleventh to sixteenth P-channel MOSFETs, respectively.

17. A basic cell according to claim 14, wherein the first and second bipolar transistors are of an NPN type.

18. In a semiconductor integrated circuit device formed on a semiconductor chip and including an internal logic circuit portion and an input and output buffer circuit portion, the internal logic circuit portion including a plurality of basic cells, at least one of the basic cells comprising:
 a first area in which a first NPN bipolar transistor is formed;
 a second area in which a second NPN bipolar transistor is formed;
 a third area in which a first N-channel MOSFET having a first predetermined gate width, and a first P-channel MOSFET having a second predetermined gate width are formed, the third area being disposed between the first and second areas; and
 a fourth area in which a second N-channel MOSFET having a third predetermined gate width larger than the first gage width, a second P-channel MOSFET having a fourth predetermined gate width larger than the second gate width, a third N-channel MOSFET having a fifth predetermined gate width smaller than the first gate width, and a fourth N-channel MOSFET are formed, the fourth area abutting the first to third areas.

19. The basic cell according to claim 18, wherein the fourth N-channel MOSFET is arranged adjacent to the first NPN bipolar transistor.

20. The basic cell according to claim 19, wherein the first P-and N-channel MOSFETs have gate electrodes, respectively, wherein the electrodes of the first P- and N-channel MOSFETs are connected to each other, and wherein the electrodes of the first P- and N-channel MOSFETs are arranged in the third area so as to extend along a predetermined straight line.

21. The basic cell according to claim 20, wherein the second P- and N-channel MOSFETs and the third N-channel MOSFET have gate electrodes, respectively, wherein at least two electrodes of the second P- and N-channel MOSFETs and the third N-channel MOSFET are connected to each other, and wherein the respective electrodes of the second P- and N-channel MOSFETs and the third N-channel MOSFET are arranged in the fourth area so as to extend along a predetermined straight line.

22. The basic cell according to claim 20, wherein the second P- and N-channel MOSFETs and the third N-channel MOSFET have gate electrodes, respectively, wherein the electrodes of the second P- and N-channel MOSFETs and the third N-channel MOSFET are connected to each other, and wherein the respective electrodes of the second P- and N-channel MOSFETs and the third N-channel MOSFET are arranged in the fourth area so as to extend along a predetermined straight line.

23. The basic cell according to claim 22, wherein a plurality of the first P- and N-channel MOSFETs are provided at the third area, and a plurality of the second P- and N-channel MOSFETs and the third N-channel MOSFET are provided at the fourth area.

24. The basic cell according to claim 22, wherein the third N-channel MOSFET is arranged between the second P- and N-channel MOSFETs, and wherein the gate electrodes of the second P- and N-channel MOSFETs and the third N-channel MOSFET are formed as one gate electrode of poly-crystalline silicon.

25. The basic cell according to claim 24, wherein the distance between the second P-channel MOSFET and the third N-channel MOSFET is longer than the distance between the third N-channel MOSFET and the second N-channel MOSFET.

26. The basic cell according to claim 20, wherein the gate electrodes of the first P- and N-channel MOSFETs are formed as one gate electrode of poly-crystalline silicon.

27. The basic cell according to claim 19, wherein the second P- and N-channel MOSFETs and the third N-channel MOSFET have gate electrodes, respectively, wherein at least two electrodes of the second P- and N-channel MOSFETs and the third N-channel MOSFET are connected to each other, and wherein the respective electrodes of the second P- and N-channel MOSFETs and the third N-channel MOSFET are connected to each other, and wherein the respective electrodes of the second P- and N-channel MOSFETs and the third N-channel MOSFET are arranged in the fourth area so as to extend along a predetermined straight line.

28. The basic cell according to claim 19, wherein the second P- and N-channel MOSFETs and the third N-channel MOSFET have gate electrodes, respectively, wherein the electrodes of the second P- and N-channel MOSFETs and the third N-channel MOSFET are connected to each other, and wherein the respective electrodes of the second P- and N-channel MOSFETs and the third N-channel MOSFET are arranged in the second area so as to extend along a predetermined line.

29. The basic cell according to claim 28, wherein the third N-channel MOSFET is arranged between the second P- and N-channel MOSFETs, and wherein the gate electrodes of the second P- and N-channel MOSFETs and the third N-channel are formed as one gate electrode of poly-crystalline silicon.

30. The basic cell according to claim 29, wherein the distance between the second P-channel MOSFET and the third N-channel MOSFET is longer than the distance between the third N-channel MOSFET and the second N-channel MOSFET.

31. In a semiconductor integrated circuit device on a substrate and including unit cell blocks which are laid out regularly in a checkered pattern on the substrate, a layout arrangement of one of the unit cell blocks comprising:
a first wiring layer for a first power supply voltage, the first wiring layer extending in a predetermined first direction;
a second wiring layer for the first power supply voltage, the second wiring layer extending in the predetermined first direction;
a third wiring layer for a second power supply voltage, the third wiring layer being disposed between the first and second wiring layers and extending in the predetermined first direction;
a first basic cell having a rectangular shape and having a first side disposed between the first and third wiring layers and extending in a predetermined second direction that is substantially a right angle direction with regard to the predetermined first direction, a second side opposite to the first side, a third side disposed between the first and second sides and extending in the predetermined first direction and disposed under the first wiring layer, and a fourth side opposite to the third side and disposed under the third wiring layer, wherein the first basic cell comprises:
a first bipolar transistor arranged at a first area adjacent to an intersection of the first side and the third side,
a second bipolar transistor arranged at a second area adjacent to an intersection of the first side and the fourth side,
first N- and P-channel MOSFET arranged at a third area disposed between the first and second areas,
a second N-channel MOSFET arranged at a fourth area adjacent to an intersection of the second side and the fourth side, wherein the second N-channel MOSFET has a predetermined gate width larger than a gate width of the first N-channel MOSFET,
a second P-channel MOSFET arranged at a fifth area adjacent to an intersection of the second side and third side, wherein the second P-channel MOSFET has a predetermined gate width larger than a gate width of the first P-channel MOSFET,
a third N-channel MOSFET arranged at a sixth area disposed between the fourth and fifth areas; and
a fourth N-channel MOSFET arranged at a seventh area disposed between the second and fourth areas;
a second basic cell arranged in mirror symmetry with respect to the first side of the first basic cell; and
third and fourth basic cells arranged between the second and third wiring layers so that the third and fourth basic cells and the first and second basic cells are arranged in mirror symmetry with respect to the third wiring layer.

32. A unit cell block according to claim 31, wherein the second, third and fourth basic cells also each include the first and second bipolar transistors, the first to fourth N-channel MOSFETs and first and second P-channel MOSFETs.

33. A unit cell block according to claim 31, wherein the first basic cell further comprises:
a third P-channel MOSFET arranged in the fifth area and having a predetermined gate width which is identical to the gate width of the second P-channel MOSFET;
a fifth N-channel MOSFET arranged in the fourth area and having a predetermined gate width which is identical to the gate width of the second N-channel MOSFET; and
a sixth N-channel MOSFET arranged in the sixth area and having a predetermined gate width which is identical to the gate width of the third N-channel MOSFET.

34. A unit cell block according to claim 33, wherein respective gate electrodes of the first P- and N-channel MOSFETs are connected to each other, wherein respective gate electrodes of the second P- and N-channel MOSFETs and third N-channel MOSFET are connected to each other, and wherein respective gate electrodes of the fifth and sixth N-channel MOSFETs and the third P-channel MOSFET are connected to each other.

35. A unit cell block according to claim 34, wherein a plurality of the first to third and fifth and sixth N-channel MOSFETs and the first to third P-channel MOSFETs are provided in the first basic cell.

36. A unit cell block according to claim 34, wherein respective gate electrodes of the first P- and N-channel MOSFETs are formed as one gate electrode of poly-crystalline silicon, wherein respective gate electrode of the second P- and N-channel MOSFETs and third N-channel MOSFET are formed as one gate electrode of poly-crystalline silicon, and wherein respective gate electrodes of the fifth and sixth N-channel MOSFETs and the third P-channel MOSFET are formed as one gate electrode of poly-crystalline silicon.

37. A unit cell block according to claim 31, wherein the first basic cell further includes a wiring region disposed between the fifth and sixth areas.

38. A unit cell block according to claim 32, wherein the first to third wiring layers are of aluminum, respectively.

39. In a semiconductor integrated circuit device on a substrate and including unit cell blocks which are laid out regularly in a checkered pattern on the substrate, a layout arrangement of one of the unit cell blocks comprising:
- a first wiring layer for a first power supply voltage, the first wiring layer extending in a predetermined first direction;
- a second wiring layer for the first power supply voltage, the second wiring layer extending in the predetermined first direction;
- a third wiring layer for a second power supply voltage, the third wiring layer being disposed between the first and second wiring layers and extending in the predetermined first direction;
- first, second, third and fourth basic cells each including a pair of bipolar transistors and a first pair of CMOSFETs, wherein said first basic cell has a rectangular shape and has a first side disposed between the first and third wiring layers and extending in a predetermined second direction that is substantially a right angle direction with regard to the predetermined first direction, a second side opposite to the first side, a third side disposed between the first and second sides and extending in the predetermined first direction and disposed under the first wiring layer, and a fourth side opposite to the third side and disposed under the third wiring layer,
- wherein the second basic cell is arranged in mirror symmetry with respect to the first side of the first basic cell so that the pairs of bipolar transistors and the first pair of CMOSFETs in the first and second basic cells will have mirror symmetry with respect to said first side; and
- wherein said third and fourth basic cells are arranged between the second and third wiring layers so that the third and fourth basic cells and the first and second basic cells are arranged in mirror symmetry with respect to the third wiring layer, such that the pairs of bipolar transistors and the first pairs of CMOSFETs of the first and third basic cells will have mirror symmetry with respect to the third wiring layer, and the pairs of bipolar transistors and first pairs of the CMOSFETs of the second and fourth basic cells will have mirror symmetry with respect to the third wiring layer.

40. A semiconductor integrated circuit device according to claim 39, wherein said second, third and fourth basic cells also have a rectangular shape, and wherein the third basic cell includes a first side disposed between the second and third wiring layers and extending in the predetermined direction that is substantially at a right angle to the predetermined first direction, and wherein the third and fourth basic cells are arranged such that the pairs of bipolar transistors and first pairs of CMOSFETs of the third and fourth basic cells will have mirror symmetry with respect to the first side of the third basic cell.

41. A semiconductor integrated circuit device according to claim 39, wherein each of said first, second, third and fourth basic cells includes a second pair of CMOSFETs having smaller gate widths than gate widths of the first pairs of CMOSFETs, and wherein the second pairs of CMOSFETs of each of the first and second basic cells have mirror symmetry with respect to the first side of the first basic cell, wherein the second pairs of CMOSFETs of the first and third basic cells will have mirror symmetry with respect to the third wiring layer, and wherein the second pairs of CMOSFETs of the second and fourth basic cells will have mirror symmetry with respect to the third wiring layer.

42. A semiconductor integrated circuit device according to claim 41, wherein said second, third and fourth basic cells also have a rectangular shape, wherein the third basic cell includes a first side disposed between the second and third wiring layers and extending in the predetermined second direction that is substantially at a right angle to the predetermined first direction, and wherein the third and fourth basic cells are arranged such that the pairs of bipolar transistors and the first and second pairs of CMOSFETs of the third and fourth basic cells will have mirror symmetry with respect to the first side of the third basic cell.

43. A basic cell for use in a semiconductor integrated circuit device on a semiconductor substrate comprising:
- a pair of bipolar transistors;
- a first P-channel MOSFET;
- a first N-channel MOSFET having a first gate width;
- a second N-channel MOSFET having a second gate width smaller than the first gate width;
- a third N-channel MOSFET having a third gate width smaller than the first gate width;
- wherein the pair of bipolar transistors are arranged at a first area,
- wherein the first to third N-channel MOSFETs and first P-channel MOSFET are arranged at a second area adjacent to the first area,
- wherein the third N-channel MOSFET is arranged nearby one of the pair of the bipolar transistors and the second N-channel MOSFET, and
- wherein gate electrodes of the first and second N-channel MOSFETs and the fist P-channel MOSFET extend along a predetermined line.

44. A basic cell according to claim 43, further comprising:
- a second P-channel MOSFET arranged in the second area; and
- a fourth N-channel MOSFET arranged in the second area,
- wherein gate electrodes of the second P-channel MOSFET and fourth N-channel MOSFET extend along a predetermined line, and wherein the gate electrodes of the first, second and fourth N-channel MOSFETs and first and second P-channel MOSFETs extend in a predetermined direction.

45. A basic cell according to claim 44, wherein the gate electrodes of the first and second N-channel MOSFETs and first P-channel MOSFET are respectively coupled in common, and wherein the gate electrodes of the second P-channel MOSFET and fourth N-channel MOSFET are respectively coupled in common.

46. A basic cell according to claim 45, wherein a plurality of the first, second and fourth N-channel MOSFETs and the first and second P-channel MOSFETs are provided in the second area.

* * * * *